US011378340B2

(12) United States Patent
Bunch et al.

(10) Patent No.: US 11,378,340 B2
(45) Date of Patent: *Jul. 5, 2022

(54) HEAT TRANSFER DEVICES AND METHODS OF COOLING HEAT SOURCES

(71) Applicant: The Boeing Company, Chicago, IL (US)

(72) Inventors: Ernest E. Bunch, Huntington Beach, CA (US); Christopher C. Veto, Hawthorne, CA (US); James J. Lucas, Huntington Beach, CA (US); Garrett W. Ek, O'Fallon, MO (US); Douglas H. Van Affelen, Huntington Beach, CA (US); Michael F. Stoia, Rancho Santa Margarita, CA (US)

(73) Assignee: The Boeing Company, Chicago, IL (US)

( * ) Notice: Subject to any disclaimer, the term of this patent is extended or adjusted under 35 U.S.C. 154(b) by 495 days.

This patent is subject to a terminal disclaimer.

(21) Appl. No.: 16/015,018

(22) Filed: Jun. 21, 2018

(65) Prior Publication Data

US 2019/0390911 A1 Dec. 26, 2019

(51) Int. Cl.
*F25B 19/00* (2006.01)
*F28C 3/08* (2006.01)
(Continued)

(52) U.S. Cl.
CPC .............. *F28C 3/08* (2013.01); *F28C 3/005* (2013.01); *F25B 19/005* (2013.01);
(Continued)

(58) Field of Classification Search
CPC ........ F28D 2021/0028; H05K 7/20272; H05K 7/20327; H05K 7/20281; H05K 7/20381; F25B 19/005
See application file for complete search history.

(56) References Cited

U.S. PATENT DOCUMENTS 1,408,631 A 3/1922 Para
3,623,546 A 11/1971 Banthin et al.
(Continued)

FOREIGN PATENT DOCUMENTS

CN 107846814 3/2018
EP 2365263 A2 * 9/2011 ............. F25D 17/02
GB 1164276 9/1969

OTHER PUBLICATIONS

European Patent Office, European Office Action for related European Patent Application No. 19181224, dated Nov. 12, 2019.
(Continued)

*Primary Examiner* — Leonard R Leo
(74) *Attorney, Agent, or Firm* — Dascenzo Gates Intellectual Property Law, P.C.

(57) ABSTRACT

A heat transfer device includes a storage chamber, a coolant housed within the storage chamber, a cooling chamber, one or more heat transfer components, a fluid passage between the storage chamber and the cooling chamber, and a barrier element. The one or more heat transfer components facilitate heat transfer from a heat source outside of the cooling chamber to the cooling chamber. The barrier element may have (i) a closed configuration, and (ii) an open configuration in which the barrier element is configured to allow the coolant in the storage chamber to flow from the storage chamber into the cooling chamber. The barrier element may reconfigure from the closed configuration to the open configuration in response to a trigger condition, such as the coolant housed within the storage chamber reaching a trigger temperature and/or the initial pressure of the coolant housed within the storage chamber reaching a trigger pressure.

31 Claims, 10 Drawing Sheets

(51) Int. Cl.
*F28C 3/00* (2006.01)
*H05K 7/20* (2006.01)
*F28D 21/00* (2006.01)

(52) U.S. Cl.
CPC .. *F28D 2021/0028* (2013.01); *F28F 2250/10* (2013.01); *H05K 7/20272* (2013.01); *H05K 7/20281* (2013.01); *H05K 7/20327* (2013.01); *H05K 7/20381* (2013.01)

(56) References Cited

U.S. PATENT DOCUMENTS

| | | | |
|---|---|---|---|
| 4,126,017 A | 11/1978 | Bytniewski et al. | |
| 4,590,538 A | 5/1986 | Cray, Jr. | |
| 4,789,517 A | 12/1988 | Webb et al. | |
| 4,838,041 A * | 6/1989 | Bellows | H01L 23/427 165/80.2 |
| 5,119,637 A | 6/1992 | Bard et al. | |
| 5,458,189 A | 10/1995 | Larson et al. | |
| 5,943,211 A | 8/1999 | Havey et al. | |
| 6,889,763 B1 | 5/2005 | Subramanian et al. | |
| 2008/0191723 A1 | 8/2008 | Osato et al. | |
| 2011/0297365 A1* | 12/2011 | Hamaguchi | F01P 3/20 165/300 |
| 2012/0103571 A1 | 5/2012 | Wu et al. | |
| 2013/0192275 A1 | 8/2013 | Loung et al. | |
| 2017/0102191 A1* | 4/2017 | Ohashi | F28F 27/02 |
| 2017/0145892 A1 | 5/2017 | Peck, Jr. et al. | |
| 2018/0170553 A1 | 6/2018 | Wang et al. | |

OTHER PUBLICATIONS

Machine-generated English translation of the abstract of CN 107846814, downloaded from Espacenet.com, Nov. 25, 2019.

* cited by examiner

HEAT TRANSFER DEVICES AND METHODS OF COOLING HEAT SOURCES

FIELD

The present disclosure relates to heat transfer devices.

BACKGROUND

Some devices, especially electronic devices, generate extensive amounts of waste heat. This heat must be controlled and dissipated properly to prevent reduced performance and/or premature failures. Therefore, the thermal interaction of any device with its environment is a critical design feature to assure its proper functionality.

There are many commercial and military applications that may require reliable thermal control systems for components that have short transient heat dissipation bursts. In addition, designing heat transfer devices for components that are inactive for long periods of time creates additional challenges. These devices must perform and/or be stored in a variety of environmental conditions, including a gradient and/or flux of ambient temperatures, pressures, vibrations, radiation dosages, magnetic fields, and/or induced currents.

SUMMARY

Heat transfer devices, electronic devices, and methods for cooling a heat source are disclosed. A heat transfer device includes a storage chamber, a coolant housed within the storage chamber, a cooling chamber, one or more heat transfer components, a fluid passage between the storage chamber and the cooling chamber, and a barrier element. The coolant may be housed within the storage chamber at an initial pressure. The one or more heat transfer components may be positioned and configured to facilitate heat transfer from a heat source outside of the cooling chamber to the cooling chamber. The barrier element may have (i) a closed configuration in which the barrier element is configured to restrict the coolant from flowing from the storage chamber through the fluid passage and into the cooling chamber, and (ii) an open configuration in which the barrier element is configured to allow the coolant in the storage chamber to flow from the storage chamber through the fluid passage and into the cooling chamber. The barrier element may be configured to reconfigure from the closed configuration to the open configuration in response to a trigger condition. In some embodiments, the trigger condition includes at least one of the coolant housed within the storage chamber reaching a trigger temperature; and the initial pressure of the coolant housed within the storage chamber reaching a trigger pressure.

A method includes storing a coolant in a storage chamber, and based upon an occurrence of a trigger condition, reconfiguring a barrier element from (i) a closed configuration in which the barrier element is configured to restrict the coolant from flowing from the storage chamber through the fluid passage, and to (ii) an open configuration in which the barrier element is configured to allow the coolant in the storage chamber to flow from the storage chamber through the fluid passage. The method further includes allowing the coolant to flow from the fluid passage and through the cooling chamber, wherein while the coolant flows through the cooling chamber heat transfers from the heat source and to the coolant via one or more heat transfer components.

The features, functions, and advantages that have been discussed can be achieved independently in various embodiments or may be combined in yet other embodiments further details of which can be seen with reference to the following description and drawings.

DESCRIPTION

Heat transfer devices, electronic devices, and methods for cooling a heat source are disclosed. Generally, in the figures, elements that are likely to be included in a given example are illustrated in solid lines, while elements that are optional to a given example are illustrated in broken lines. However, elements that are illustrated in solid lines are not essential to all examples of the present disclosure, and an element shown in solid lines may be omitted from a particular example without departing from the scope of the present disclosure.

The heat transfer devices described herein can be used to passively cool a heat source, such as electronics that may generate heat. As heat transfers from the heat source and to the heat transfer device, the pressure and/or temperature of a coolant stored in a chamber of the heat transfer device increases. Once the pressure and/or temperature of the coolant reaches a threshold pressure and/or temperature, a passive event allows the coolant to flow out of the chamber. The coolant then cools the heat source by absorbing additional heat via one or more heat transfer components.

Figure 1:
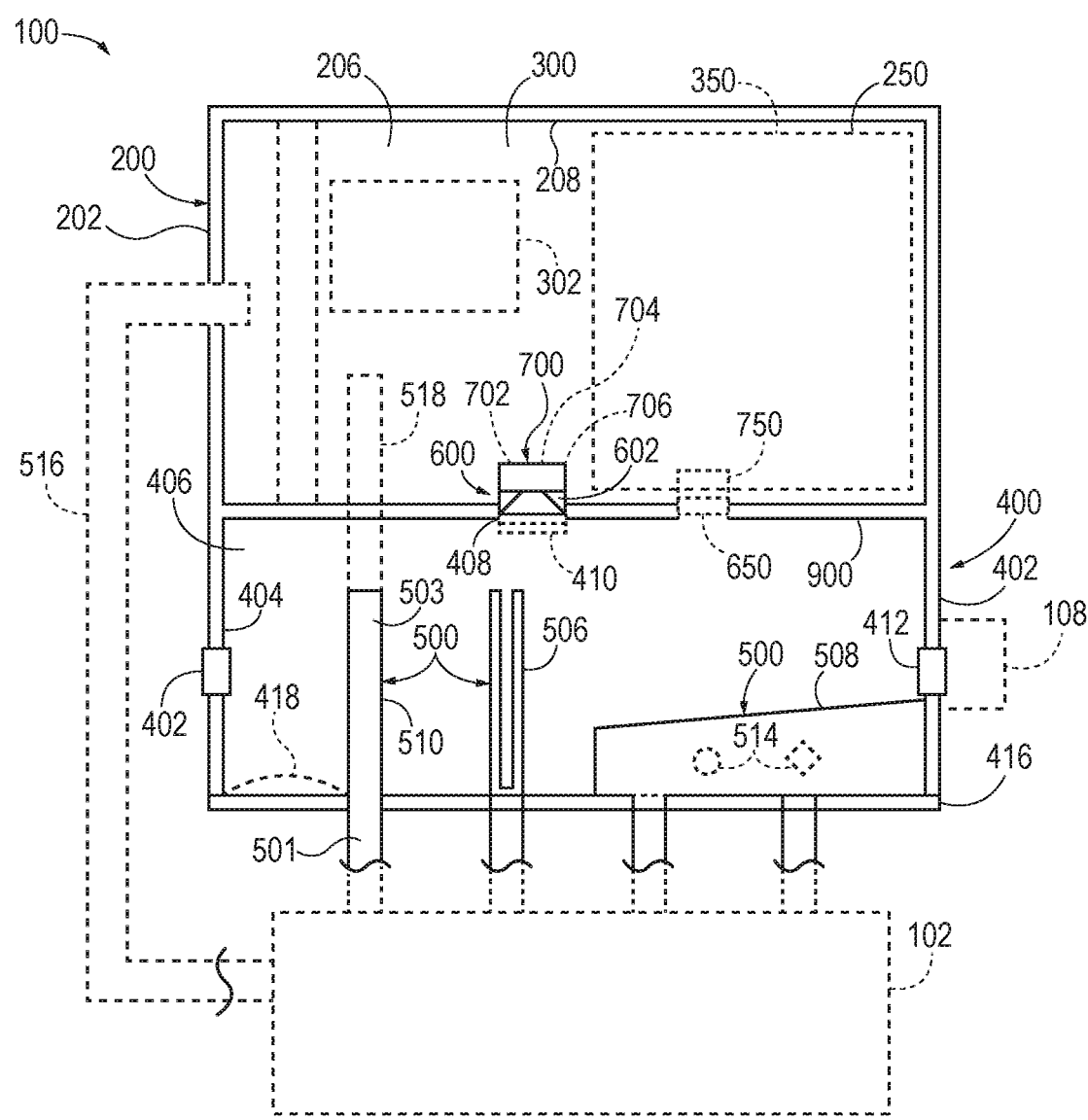
FIG. 1 is a schematic diagram representing heat transfer devices according to the present disclosure.

FIG. 1 is a schematic diagram representing heat transfer devices 100 according to the present disclosure. In some embodiments, heat transfer devices 100 may be referred to as a Thermal Exchange Wafer (TEW). As illustrated in FIG. 1, a heat transfer device 100 may be configured to draw heat away (i.e., cool) a heat source 102. A heat source 102 may include an active component that generates heat, such as an engine, electronic component, etc. Alternatively, or in addition, heat source 102 may include a component that passively acquires heat from another source, such as a heat shield, a heat sink, etc. In such embodiments, the heat transfer device 100 may be configured to draw heat away from the heat source 102.

As schematically illustrated in FIG. 1, heat transfer devices 100 include at least a storage chamber 200, a coolant 300 housed within the storage chamber 200, a cooling chamber 400, one or more heat transfer components 500, a fluid passage 600 between the storage chamber 200 and the cooling chamber 400, and a barrier element 700. The barrier element 700 is configured to have a closed configuration in which the barrier element 700 restricts the coolant 300 from flowing from the storage chamber 200, and an open configuration in which the barrier element 700 allows the coolant 300 in the storage chamber 200 to flow through the fluid passage 600 and into the cooling chamber 400.

Figure 2:
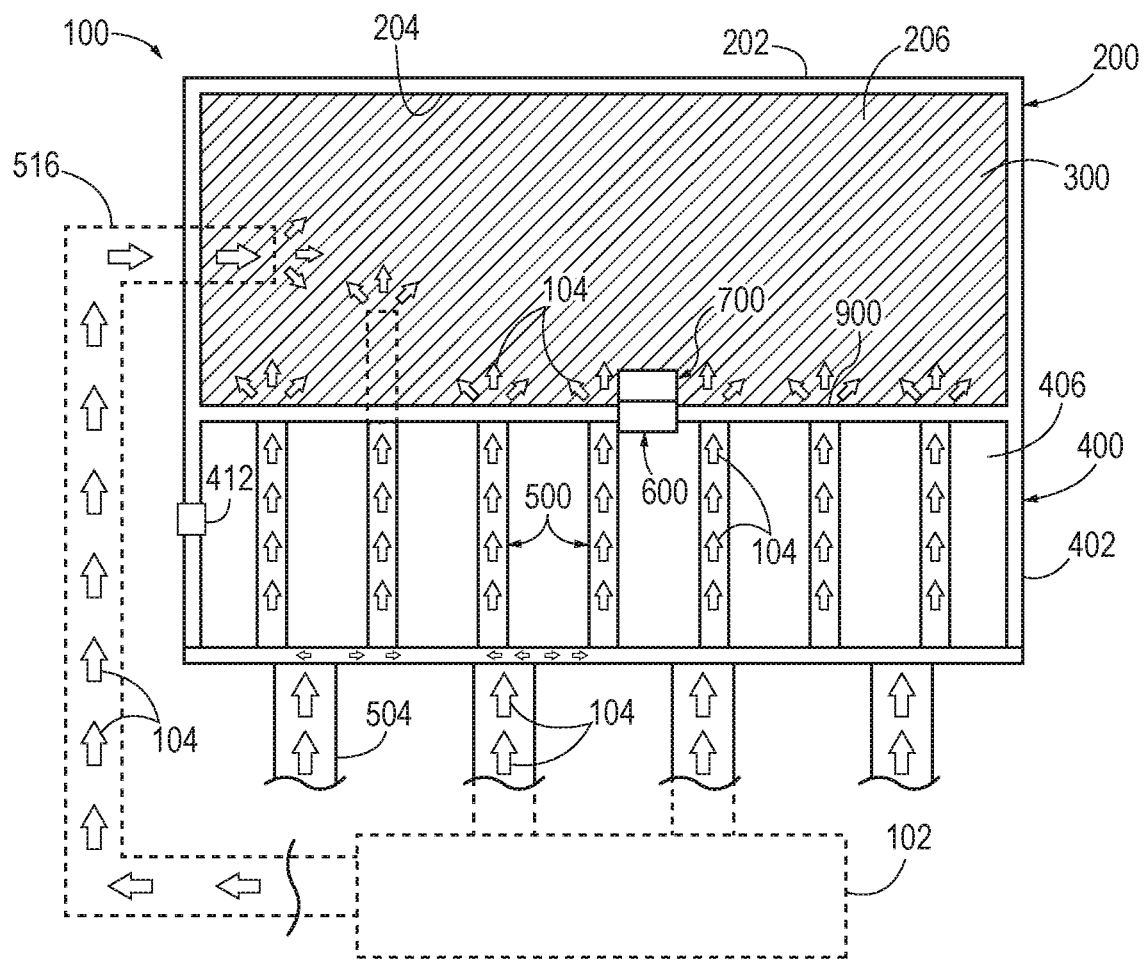
FIG. 2 is a schematic diagram representing example heat transfer devices in which the barrier element is in the closed configuration.

FIG. 2 illustrates example heat transfer devices 100 in which the barrier element 700 is in the closed configuration. FIG. 2 illustrates heat 104 flowing from heat source 102 to the coolant 300 during operation of the heat transfer devices 100. Heat 104 may flow from the heat source 102 and through the heat transfer components 500, a storage housing 202, a cooling housing 402, a storage heat transfer component 516, another heat transfer means (such as a radiation and/or other environmental conductors located proximate to the heat transfer devices 100 and/or heat source 102), or a combination thereof. FIG. 2 further shows the heat 104 flowing into the coolant 300. In this way, when the barrier element 700 is in the closed configuration, the heat transfer device 100 draws heat 104 away from the heat source 102 and stores heat 104 in the coolant 300. Such heat transfer may (or may not) be described as Forced convection, where buoyancy force is gαθL, where L is a length scale, and θ is a temperature scale, as described by DJT's Physical Fluid Dynamics 2nd edition Ch. 14, Convection.

Additionally, when the barrier element 700 is in the closed configuration, the transfer of heat 104 into the coolant 300 causes the temperature of the coolant 300 to increase. Because the volume enclosed by the storage chamber 200 is a fixed volume, the pressure of the coolant 300 increases in correspondence with the temperature increase and according to the properties of thermal expansion of the coolant 300. In some embodiments, the heat transfer devices 100 also include a heat distribution element 302 located within the enclosed storage volume 206, and which is configured to distribute heat 104 across the coolant 300. For example, the heat distribution element 302 may include an aluminum foam, or other conductive mesh through which heat 104 can be distributed across and into the coolant 300.

Figure 3:
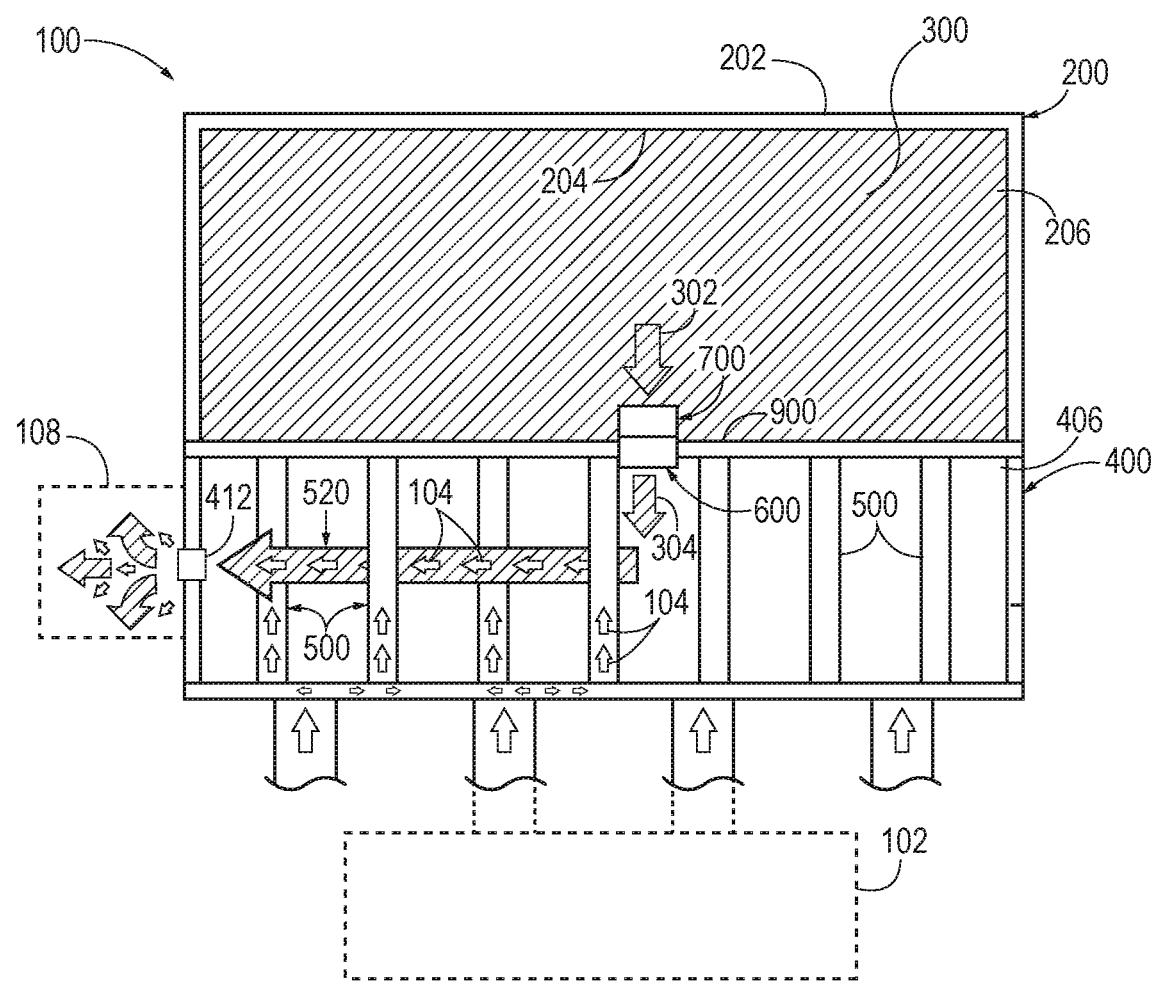
FIG. 3 is a schematic diagram representing example heat transfer devices in which the barrier element is in the open configuration.

FIG. 3 illustrates example heat transfer devices 100 in which the barrier element 700 is in the open configuration. FIG. 3 shows a coolant path 304 along which the coolant 300 flows from the enclosed storage volume 206, through the fluid passage 600, and into cooling chamber 400. The pressure of the coolant 300 in the storage chamber 200 may drive the flow of coolant 300 through the fluid passage 600 and into the cooling chamber 400. That is, because the pressure of the coolant 300 in the storage chamber 200 is greater than the pressure in the cooling chamber 400, the coolant 300 may passively flow from the storage chamber 200 to the cooling chamber 400. According to the thermodynamic properties of the coolant, the temperature of the coolant 300 will drop as the coolant 300 expands into the cooling chamber 400. Alternatively, or in addition, the temperature of the coolant 300 also may be reduced by an expansion device (e.g., a thermal expansion valve, an expansion valve, an expansion element, a capillary tube, etc.) in the fluid passage 600.

Once the coolant 300 enters the cooling chamber 400, FIG. 3 illustrates the coolant flowing along one or more coolant flow paths 520 and to an exit interface 412. FIG. 3 also shows heat 104 flowing from the heat transfer components 500 and into the coolant 300. Once the coolant 300 reaches the exit interface 412, both the coolant 300 and the heat 104 which the coolant 300 has absorbed is exhausted into an exhaustion region, such as the environment, an overflow tank 108, or other location outside of the cooling chamber 400. In this way, when the barrier element 700 is in the open configuration, the passive flow of the coolant 300 causes the heat transfer device 100 to both draw heat 104 away from the heat source 102 and exhaust the heat 104 into an exhaustion region. In some embodiments, the cooling chamber 400 includes one or more test ports. Such test ports may be used for functions including but not limited to Non-Destructive Testing (NDT) and/or Non-Destructive Inspection (NDI), a leak test, a flow test, testing of safety/reliability/mission-reliability/repeatability, injection of fluid or some other substance into the cooling chamber, drawing of a vacuum and/or altering the pressure in the cooling chamber, cleaning of the chamber including removal of grit/FOD and/or unsintered AM powder, and/or an additional exhaust port during operation of the device; though other methods and/or devices may achieve these functions including the single exhaust port in contribution with or disjoint from the test ports; and such test ports may be permanently or temporarily sealed.

The coolant 300 will continue to passively flow out of the storage chamber 200 until the pressure of the coolant 300 in the storage chamber 200 and the pressure in the cooling chamber 400 reach equilibrium. Additionally, the mass flow rate of the coolant 300 out of the storage chamber 200 will be relationally dependent upon the pressure difference between the pressure of the coolant 300 in the enclosed storage volume and the pressure in the cooling chamber 400. This will cause the mass flow rate of the coolant 300 to reduce as the storage chamber 200 and the pressure in the cooling chamber 400 equilibrate.

Moreover, while not specifically illustrated in FIG. 3, according to the present disclosure the transfer of heat 104 from the heat source 102 to the coolant 300 depicted in FIG. 2 continues to occur while the barrier element 700 is in the open configuration. In this way, while the barrier element 700 is in the open configuration, the heat 104 which continues to flow into the coolant 300 in the storage chamber 200 increases the pressure of the coolant 300 in the storage chamber 200, thus driving a continued flow of coolant 300 into the cooling chamber 400.

As illustrated in FIGS. 1-3, the storage chamber 200 may include a storage housing 202. An internal surface 204 of the storage housing 202 defines an enclosed storage volume 206. The storage housing 202 and the enclosed storage volume 206 may take various suitable shapes depending on application and/or volumetric requirements for specific applications. As illustrative examples, the storage housing 202 and/or the enclosed storage volume may be cylindrical, a rectangular prism, or any other shape. As illustrated in FIGS. 1-3, a coolant 300 is stored within the enclosed storage volume 206. The coolant 300 may include any substance capable of efficiently absorbing heat. Within normal operating conditions for which a particular heat transfer device is designed, the coolant 300 is able to flow from the storage chamber 200 to the cooling chamber 400 through the fluid passage 600 when the barrier element 700 is in a fully and/or partially open configuration, as schematically represented in FIG. 3. The coolant 300 may be a liquid at normal operating conditions of the heat transfer devices 100. Normal operating conditions of the heat transfer devices 100 include a range of potential conditions (e.g., temperature, pressure, humidity, etc.) that are likely to exist during the course of an undertaking for which a particular heat transfer device 100 is designed. In this way, depending on the purposes of individual heat transfer devices, different coolants 300 may be selected that have characteristics that align with the normal operating conditions of the corresponding heat transfer device 100.

In some embodiments, the coolant 300 may be selected for its ability to remain in a stable condition for long periods of time. Examples of such periods of time include $10^{-18}$, $10^{-15}$, $10^{-9}$, $10^{0}$, $10^{1}$, $10^{2}$, $10^{3}$, $10^{4}$, $10^{5}$, $10^{6}$, $10^{7}$, $10^{8}$, at least $10^{-18}$, at least $10^{-15}$, at least $10^{-9}$, at least $10^{0}$, at least $10^{1}$, at least $10^{5}$, at least $10^{10}$, less than $10^{-18}$, less than $10^{-15}$, less than $10^{-9}$, less than $10^{0}$, less than $10^{1}$, less than $10^{5}$, and/or less than $10^{10}$, seconds, minutes, hours days, weeks, months, years, decades, or other units of time. However, others may be used without departing from the scope of the present disclosure. For example, where a heat transfer device 100 is designed to cool an electronic component of a spacecraft, the coolant may need to remain stable in the storage chamber for years before the electronic component is activated and/or otherwise generates heat. To achieve this level of stability, the coolant 300 may be such that a boiling point temperature is greater than a range of operating temperatures of the heat transfer device, and/or a freezing point temperature is less than a range of operating temperatures of the heat transfer device. This may allow the heat transfer device 100 to remain dormant for long periods of time without the coolant breaking down, losing/altering its functional properties, or damaging the heat transfer device 100. For example, the coolant 300 may partially and/or entirely comprise methane. In some embodiments, the coolant 300 may include component elements that improve the stability of the coolant 300. For example, the coolant may include a component element that is itself a fire retardant, or which, when combined with other components of the coolant 300 prevent the coolant 300 from igniting. Alternatively, or in addition, the coolant 300 may include component elements that improve and or provide a voltage-carrying capability of the coolant 300. For example, the coolant may optionally include a mixture of water and manganese sulfate. In some embodiments, the heat transfer devices 100 may include storage heat transfer component 516. The storage heat transfer component 516 may be a component distinct from the heat transfer components 500, and which is configured to permit heat to transfer between the heat source 102 without passing through the cooling chamber 400.

The fluid passage 600 is configured to allow coolant 300 to flow from the storage chamber 200 to the cooling chamber 400. In some embodiments, the fluid passage 600 is configured to expand the coolant 300 as it flows through the fluid passage. For example, coolant 300 may flow into the fluid passage 600 at an initial pressure, and may flow out of the fluid passage 600 at an expanded pressure that is lower than the initial pressure. The reduction of the pressure of the coolant 300 may be a result of the coolant 300 moving from the enclosed storage volume 206 such that it is housed within an increased volume (i.e., from the enclosed storage volume 206 to an area including both the enclosed storage volume 206 and the enclosed cooling volume 406), may be a result of the coolant 300 passing through an expansion device (e.g., a thermal expansion valve, an expansion valve, an expansion element, a capillary tube, etc.) as the coolant 300 moves through the fluid passage 600, or a combination thereof. For example, the fluid passage 600 may include an expansion valve 602 coupled to the storage chamber 200 and/or the cooling chamber 400. In such embodiments, the coolant 300 flows from the storage chamber and into such an expansion valve 602 at an initial pressure, and flows out of the expansion valve 602 and toward the cooling chamber 400 at an expanded pressure that is less than the initial pressure. Alternatively, or in addition, the expansion valve 602 and/or another component of the fluid passage 600 may cause the coolant 300 to transition from a liquid state to a gaseous state. For example, in some embodiments, coolant 300 is stored in the enclosed storage volume 206 in a liquid state, but is a gas when the coolant 300 flows into the cooling chamber 400 via the fluid passage 600.

The fluid passage 600 may include a fluid chamber 640. The fluid chamber 640 may be an enclosed volume that coolant enters via the barrier element 700 when the barrier element 700 is in an open configuration. Coolant 300 may exit the fluid chamber 640 and enter the enclosed cooling volume 406. Additionally, in some embodiments, the fluid passage 600 may be a shared fluid passage 660 into which coolant 300 flows when any individual barrier element 700 of a set of more than one barrier element 700 is in an open configuration.

As illustrated in FIGS. 1-3, heat transfer device 100 also includes a cooling chamber 400 that is located adjacent to the storage chamber 200. Cooling chamber 400 includes a cooling housing 402 that has an internal surface 404 which defines an enclosed cooling volume 406. One or more of the cooling housing 402 and/or the enclosed cooling volume 406 may be cylindrical, a rectangular prism, or any other shape. The shape of the enclosed cooling volume 406 may be the same shape as the enclosed storage volume 206, or may be a different shape.

The heat transfer device 100 may further include a through hole 408 that is located at an interface between the fluid passage 600 and the enclosed cooling volume 406. The through hole 408 is defined by the storage housing 202 and/or cooling housing 402, and is configured to allow coolant 300 to flow from the fluid passage 600 to the enclosed cooling volume 406. The through hole 408 may be located at a central region of the cooling chamber 400. Alternatively, the through hole 408 may be positioned at any other location of the cooling chamber 400, such as along a side region of the cooling chamber 400. Moreover, according to the present disclosure the heat transfer device 100 may include two or more through holes 408 through which coolant can pass from the fluid passage 600 to the enclosed cooling volume 406. In such embodiments, the two or more through-holes can be radially symmetric or radially asymmetric. For example, where the heat transfer device 100 includes three or more through holes, all may be symmetric, asymmetric, or a sub-set may be symmetric. Additionally, individual through holes do not have to be circular, and they may take on any shape, including a square, a trapezoid, etc. In some embodiments, the heat transfer device 100 also includes an adapter 410 positioned in or adjacent to a through hole 408 that is configured to convert the shape of the corresponding through hole 408. For example, an adapter 410 may be placed in a circular through hole 408 to convert it to a trapezoidal through hole 408.

The cooling chamber 400 also may include one or more exit interfaces 412 configured to allow the coolant 300 to flow out of the enclosed cooling volume 406. An exit interface 412 may correspond to a hole defined by the cooling housing 402. The coolant may flow out of the enclosed cooling volume 406 and into an exhaustion region, such as the environment 106, an overflow tank 108, or another location outside of the enclosed cooling volume 406. In some embodiments, the exit interface 412 may allow coolant 300 to flow from the enclosed cooling volume 406 to a chimney 414 that allows the coolant to flow through or adjacent to the enclosed storage volume 206, and/or one or more other components of the heat transfer device 100. Alternatively, or in addition, the cooling chamber 400 may include a sewer structure configured to direct the flow of coolant 300 toward and/or through the enclosed cooling volume 406. In some embodiments, the sewer structure may also direct the flow of coolant 300 out of the enclosed cooling volume 406, and/or the heat transfer device 100.

Heat transfer device 100 also includes one or more heat transfer components 500 that are configured to allow heat to transfer between the heat source 102 and the enclosed cooling volume 406. Individual heat transfer components 500 may include a heating end 501 located proximate to the heat source 102 and a cooling end 503 located within the enclosed cooling volume 406. The heating end 501 may be operatively coupled to the heat source 102 such that heat 104 generated by the heating source flows to the heating end 501. In some embodiments, the heat transfer components 500 may include a conductive portion 518 that extends into the enclosed storage volume 206. Alternatively, or in addition, a barrier 900 between the enclosed cooling volume 406 and the enclosed storage volume 206 may correspond to and/or optionally include a heat transfer component 500, such as a conductive film, coating, layer and/or other barrier structure that partially or completely separates the enclosed cooling volume 406 from the enclosed storage volume 206. For example, such a barrier 900 may include one or more of a braze foil 902, a parting sheet with fin array, and/or other conductive components that are configured to allow heat to transfer into the enclosed storage volume 206 and/or evenly distribute the heat across the barrier.

According to the present disclosure, the one or more heat transfer components 500 may include pins 506, vanes 508, rods 510, fins, and/or other structures that are configured to allow heat to transfer between the heat source 102 and the enclosed cooling volume 406. For example, the heat transfer components 500 may include a plurality of sponge rods distributed within the enclosed cooling volume. Heat transfer device 100 may include a number of pins 506, rods 510, or a combination thereof arranged within the enclosed cooling volume 406 in a matrix array, an off-set matrix array, a spiral array, or any other distributed pattern. The size of individual pins 506, vanes 508, rods 510, fins, and/or other heat transfer components may be constant or may vary in size. For example, in some embodiments, heat transfer components 500 located near through hole 408 may be smaller (i.e., have a smaller radius, surface area, height, etc.) than heat transfer components 500 located further from the through hole 408. The cross sectional shape of pins 506 and/or rods 510 may be circular, ovoid, polygonal, Vesica Piscis, or another shape.

In some embodiments, some or all of the cooling housing 402 may comprise a conductive material that distributes heat from the heat source 102 to the enclosed cooling volume 406. For example, a side and/or portion 416 of the cooling housing 402 may comprise a conductive material that distributes heat from the heat source 102 to the enclosed cooling volume 406, the internal surface 404, and or one or more pins 506, vanes 508, rods 510, fins, and/or other structural components of the heat transfer components 500. The side and/or portion 416 of the cooling housing 402 may be a flat side/portion, or may have raised, curved, or other irregularities 418 that increase the surface area for heat transfer between the side and/or portion 416 and the enclosed cooling volume 406.

The heat transfer device 100 may further include one or more vanes or other structures configured to guide the flow of coolant 300 through the enclosed cooling volume 406 from the through hole 408 to the exit interface 412. The vanes or other structures may optionally include cutouts 514 that are configured to allow the coolant to flow through the vanes. The cutouts 514 also may be described as voids, holes, openings, passages, passageways, etc. The cutouts 514 may be circular, ovoid, polygonal, diamond, or another shape. The cutouts may alter the wall shear $\tau_w$, as defined by Shapiro's *The Dynamics and Thermodynamics of Compressible Fluid Flow* Ch. 27, Volume 2. Such diamond through holes may fully penetrate walls of the structure; including vanes mentioned above, where such walls may have constant or varying thickness, with flat or non-flat surfaces, crescent shaped in this instantiation. In some embodiments, the one or more vanes or other structures may be heat transfer components 500 configured to allow heat to transfer from the heat source 102 to the enclosed cooling volume 406. For example, the heat transfer components 500 may include vanes 508, fins, or other structures that are positioned to guide the flow of coolant 300 along a coolant flow path 520. In various embodiments, individual vanes 508, fins, or other structures may have a constant width, a varying width, a constant height, a varying height, be perpendicular to an associated surface of the cooling housing 402, have a camber angle between the individual vane 508 and the associated surface of the cooling housing 402, or a combination thereof.

The coolant flow path 520 may include one or more switchbacks 522. In some embodiments, there may be two or more coolant flow paths 520 through which coolant 300 can flow from a through hole 408 to an exit interface 412. For example, where the through hole 408 is centrally located in the enclosed cooling volume 406, the vanes or other structures may define a plurality of coolant flow paths 520 that lead radially outward from the through hole 408.

According to the present disclosure, the heat transfer device 100 also includes a barrier element 700 that is configured to control the flow of coolant 300 from the storage chamber 200 to the cooling chamber 400. The barrier element 700 is configured to have a closed configuration in which the barrier element 700 restricts the coolant 300 from flowing from the storage chamber 200, and an open configuration in which the barrier element 700 allows the coolant 300 in the storage chamber 200 to flow through the fluid passage 600 and into the cooling chamber 400.

Example barrier elements 700 may include, but are not limited to, any combinations of burst discs, permeable membranes, plungers, release valves, pressure release valves, check valves, pyrotechnic valves, solenoid valves, ball and spring valves, etc.

According to the present disclosure, the barrier element 700 is configured to reconfigure from the closed configuration to the open configuration in response to a trigger condition. For example, the trigger condition may correspond to the coolant 300 housed in the enclosed storage volume 206 reaching a certain temperature, the current pressure (i.e., the pressure at a corresponding time, a present time, or current time) of the coolant 300 housed in the enclosed storage volume 206 reaching a certain pressure level, or a combination thereof.

In some embodiments, the barrier element 700 is configured to passively transition from the closed configuration to the open configuration. That is, the barrier element 700 may not require a signal or other stimulus from outside of the heat transfer device 100 to transition from the closed configuration to the open configuration. For example, the barrier element 700 may be configured to passively transition from the closed configuration to the open configuration in response to operating conditions of the heat transfer device 100 (e.g., conditions of the coolant 300 in the enclosed storage volume 206, etc.).

For example, the barrier element 700 may include a burst disc 702 that forms a barrier that restricts the coolant 300 from flowing from the enclosed storage volume 206, and which is configured to rupture when a pressure that the coolant 300 applies to the burst disc 702 exceeds a certain pressure level. In various embodiments, one or more of the characteristics of the burst disc 702 (e.g., size, thickness, component materials, elasticity, etc.), the characteristics of the coolant 300 (e.g., the type of coolant, the component ingredients of the coolant, etc.), and the initial conditions of the heat transfer device 100 (e.g., a size of the enclosed storage volume 206, an amount of the coolant 300, an initial pressure of the coolant 300, etc.) may be designed so that the burst disc 702 ruptures when the coolant 300 reaches a set temperature. That is, when characteristics of the heat transfer device 100 are so designed, when the coolant 300 reaches the set temperature the coolant 300 will exert an amount of pressure on the burst disc 702 that is sufficient to rupture the burst disc 702.

Alternatively, or in addition, the barrier element 700 may include a membrane 704 through which coolant 300 can only pass through when certain conditions are met. For example, the membrane 704 may be configured to restrict the coolant 300 from flowing from the enclosed storage volume 206 when the pressure exerted by the coolant 300 onto the membrane 704 is below a threshold pressure, and may be configured to allow the coolant 300 to flow across the membrane 704 when the pressure that the coolant 300 applies to the membrane 704 exceeds the pressure threshold.

Figure 7:
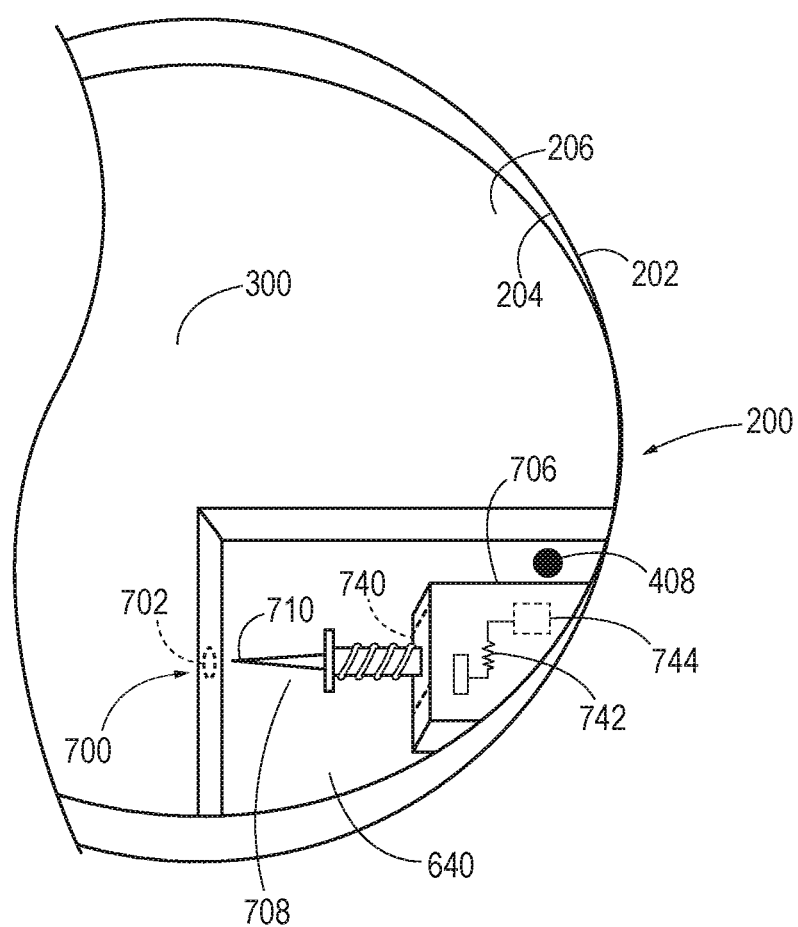
FIG. 7 is a diagram of an example cylindrical storage chamber in which the barrier device includes a plunger device.

Moreover, the barrier element 700 may include at least one plunger device 706 that is configured to create a passage through which the coolant 300 is able to flow from the enclosed storage volume 206 to the fluid passage 600. The plunger device 706 may include a puncturing needle 708 having a puncturing end 710, such as a needle tip and/or a hollow tip. In some embodiments, the plunger device 706 includes a driving mechanism that causes the puncturing end 710 to rupture a barrier or burst disc 702 or other barrier responsive to the trigger condition. For example, the plunger device 706 may include a pressure tab that is configured to burst when a pressure exerted on the pressure tab exceeds a threshold value, or when the temperature of the pressure tab exceeds a threshold value. In another example, as illustrated in FIG. 7, the plunger device 706 may optionally include a restraining element 740 that prevents the plunger device 706 from moving to a neutral position, wherein the plunger device 706 moving to the neutral position includes creating the passage through which the coolant 300 is able to flow from the enclosed storage volume 206 to the fluid passage 600. In such embodiments, the plunger device 706 may include a spring, piston, or other dynamic mechanism that biases the plunger device 706 to the neutral position. The restraining element 740 may be configured to restrain the plunger device 706 in a non-neutral position until the occurrence of a trigger event. For example, the restraining element 740 may comprise a material (e.g., wax, lead, etc.) that melts at a threshold temperature, where once melted, the plunger device 706 is allowed to move to the neutral position. In some embodiments, the plunger device 706 also may be configured to plug the passage in response to a close condition, such as a closing pressure being applied to the plunger device, the plunger device 706 reaching a closing temperature, etc.

As illustrated in FIG. 7, in some embodiments, the heat transfer device 100 also may include a closed circuit 742 that is configured to control and/or initiate the transition of the barrier element 700 from the closed configuration to the open configuration. The closed circuit 742 may include a sensor 744, such as a pressure sensor (e.g., strain gauge), a temperature sensor (e.g., thermocouple), or other sensor that is configured to detect the occurrence of a trigger condition. For example, the closed circuit 742 may include a thermocouple that is configured to produce a voltage sufficient to cause the barrier element 700 to transition between the closed configuration and the open configuration.

Additionally, as schematically illustrated in dashed lines in FIG. 1, heat transfer device 100 also may optionally include one or more additional storage chambers 250, additional coolants 350 housed within the additional storage chambers 250, additional fluid passages 650 between the additional storage chambers 250 and the cooling chamber 400, and additional barrier elements 750. In some embodiments, the heat transfer device 100 may include a plurality of additional storage chambers 250, where each individual additional storage chamber 250 stores additional coolant 350. Similar to barrier element 700, individual additional barrier elements 750 may be configured to have a closed configuration in which the additional barrier element 750 restricts the additional coolant 350 from flowing from the additional storage chamber 250, and an open configuration in which the additional barrier element 750 allows the additional coolant 350 in the additional storage chamber 250 to flow through the additional fluid passage 650 and into the cooling chamber 400.

In some embodiments, individual additional barrier elements 750 are configured to reconfigure from the closed configuration to the open configuration in response to an additional trigger condition(s) that are different from the trigger conditions for barrier element 700. For example, the additional trigger condition for an additional barrier element 750 may correspond to one or both of (i) the additional coolant 350 housed within the additional storage chamber 250 reaching an additional trigger temperature, and (ii) the initial pressure of the additional coolant 350 housed within the additional storage chamber 250 reaching an additional trigger pressure. The additional fluid passage 650 may be configured to expand the additional coolant 350 from an initial pressure to an expanded pressure as the additional coolant 350 flows from the additional storage chamber 250 through the additional fluid passage 650 and to the cooling chamber 400 responsive to the additional barrier element 750 reconfiguring from the closed configuration to the open configuration. Alternatively, or in addition, the fluid passage 600 may be a shared fluid passage 660, and the additional barrier element 750 may be configured to allow the additional coolant 350 to flow into the shared fluid passage 660.

According to the present disclosure, at least one of the component elements of the heat transfer device 100 may be constructed using additive manufacturing. For example, one or more heat transfer components 500 may be partially or completely constructed and/or otherwise added to the enclosed cooling volume 406 using additive manufacturing. Example additive manufacturing methods and printers include, but are not limited to, VAT photopolymerization, powder bed fusion, binder jetting, material jetting, sheet lamination, material extrusion, directed energy deposition, directed metal laser sintering, direct metal printing, electron beam additive manufacturing, electron beam melting, electron beam powder bed, fused deposition modeling, indirect power bed, laser cladding technology, laser deposition technology, laser deposition welding, laser deposition welding with integrated milling, laser engineering net shape, laser freeform manufacturing technology, laser metal deposition-powder, laser metal deposition-wire, laser powder bed, laser puddle deposition, laser repair technology, powder directed energy deposition, stereolithography, selective laser melting, selective laser sintering, small puddle deposition, as well as hybrid processes thereof. For example, powder may be formed as collected waste powder or produced powder from Electrical Discharge Machining (EDM) machining processes.

Exemplary additive manufacturing materials include metals such as steel, stainless steel, titanium, copper, aluminum, nickel alloys, and alloys thereof, including but not limited to IN625, IN718, Ti-6Al-4V, Al—Si10-Mg, SS316, Monel, Monel K500, Copper, Ti-5553, Ti-6Al-6V-2Sn, Ti-6242, Maraging Steel MSI 18, Mar 300, 316L, 17-4, 15-4, Cobalt Chrome SP2, Ti-6Al-4V ELI, Nickel Alloy HX, gold (Au), silver (Ad as well as plastics/polymers/elastomers including Acrylonitile Butadiene Styrene (ABS), Polylactic acid (PLA), Polyvinyl alcohol, and Polycarbonate, and others including ULTEM, Kel-F, Kevlar, Nylon, and Carbon Composite, as well as thermoplastics such as Polyamide (PA), Polyphenylene Sulfide (PPS), Polyether Ether Ketone (PEEK), Poly-Ether-Ketone-Ketone (PEKK), Polyetherimide (PEI), Polyphenylsulfone (PPSU), Polyethersulfone (PES), Thermoplastic Polyimide (TPI), liquid crystalline polymer (LCP), polyimide-imide (PAI), or the like.

Alternatively, or in addition, the heat transfer device disclosed herein may be partially or completely formed of, or may otherwise include Functionally Gradient Material (FGM). For example, a component element of the fluid passage 600, such as an expansion valve or other type of valve, may be formed of a FGM that comprises a blend from Ti-6Al-4V to Al-Si10-Mg. In one example, the structure disclosed herein may be formed by altering the blending of deposited additively manufactured material such that Functionally Gradient Material (FGM) properties may be achieved, including varying the Coefficient of Thermal Expansion (CTE). Such varying may be useful for passive actuation of puncturing devices.

Further, in the construction of the heat transfer devices disclosed herein, support materials may be used, such as support materials for plastics like PVA or support materials for metallic elements, including water-soluble crystals and other melt-aways, including, but not limited to Cu, Ag, Al, Sb, Zn and Sn, as well as other alloys such as solder and low melting point Ag alloy solder (Ag—Sn—Pb, Ag—Pb, Ag—Sn, Ag—Sn—Cu, Ag—Cd—Zn, Ag—Cd); polyethylene, polyamide, polyimide, polypropylene, PMMA, polyether sulfone, thermoplastic polyester, copolymer or polyhexafluroropropylene and polytetrafluoroethylene, polyfluorovinylidene, and other organic composite photoresist materials, including but not limited to dry film type resists such as those discussed in U.S. Pat. No. 5,805,971. The device also may be constructed with non-thermoplastic materials, including epoxies, including high-temp resistant epoxies.

One or more parts of the structure also may be formed from plastics, including but not limited to Nylon, acrylonitrile butadiene styrene, polyactic acid, polyetherimide (ULTEM®), Carbon fiber, para-aramid synthetic fibers (KEVLAR®), polychlorotrifluoroethylene, polytetrafluoroethylene (TEFLON™), and polyethylene terephthalate. In some embodiments, the structure may be constructed of flexible material for purposes of resiliency to high-vibration regimes, flexure in aeroelastic applications.

Turning now to FIGS. 4-14, illustrative non-exclusive examples of storage chambers 200 and cooling chambers 400 according to the present disclosure are illustrated. Where appropriate, the reference numerals from the schematic illustrations of FIGS. 1-3 are used to designate corresponding parts of the examples of FIGS. 4-14; however, the examples of FIGS. 4-14 are non-exclusive and do not limit heat transfer devices 100 to the illustrated embodiments of FIGS. 4-14. That is, heat transfer devices 100 according to the present disclosure are not limited to the specific embodiments of the example storage chambers 200 and cooling chambers 400 illustrated in FIGS. 4-14, and heat transfer devices 100 may incorporate any number of the various aspects, configurations, characteristics, properties, etc. of heat transfer devices 100 that are illustrated in and discussed with reference to the schematic representations of FIGS. 4-14 and/or the embodiments of FIGS. 4-14, as well as variations thereof, without requiring the inclusion of all such aspects, configurations, characteristics, properties, etc. For the purpose of brevity, each previously discussed component, part, portion, aspect, region, etc. or variants thereof may not be discussed, illustrated, and/or labeled again with respect to the examples of FIGS. 4-14; however, it is within the scope of the present disclosure that the previously discussed features, variants, etc. may be utilized with the examples of FIGS. 4-14 in various embodiments of the disclosed invention.

Figure 4:
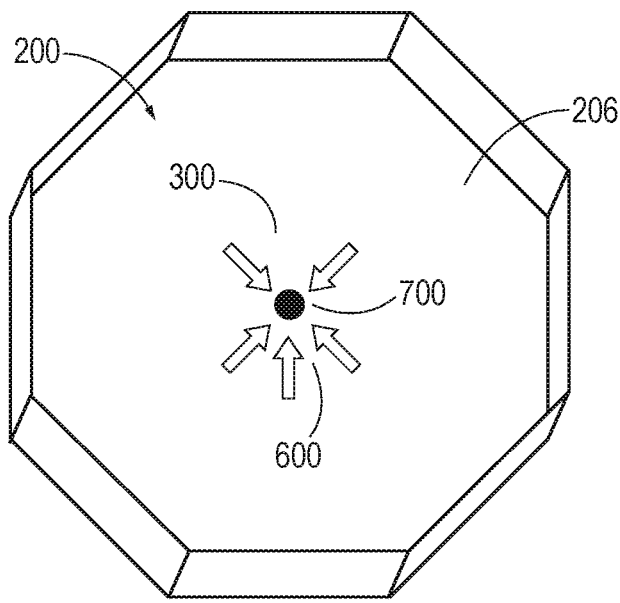
FIG. 4 is a diagram of an example storage chamber having a polygonal prism shape, and in which the barrier device is a burst disc or membrane centrally located within the storage chamber.
Figure 5:
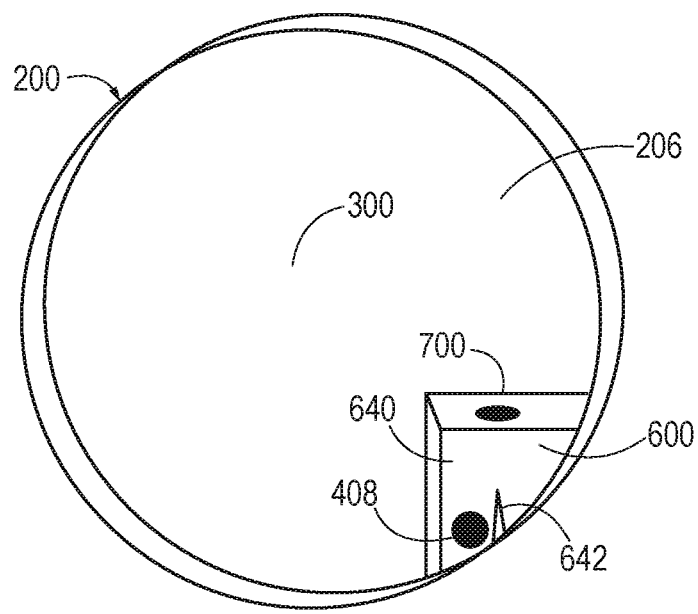
FIG. 5 is a diagram of an example cylindrical storage chamber in which the barrier device is a burst disc or membrane that is not centrally located within the storage chamber.
Figure 6:
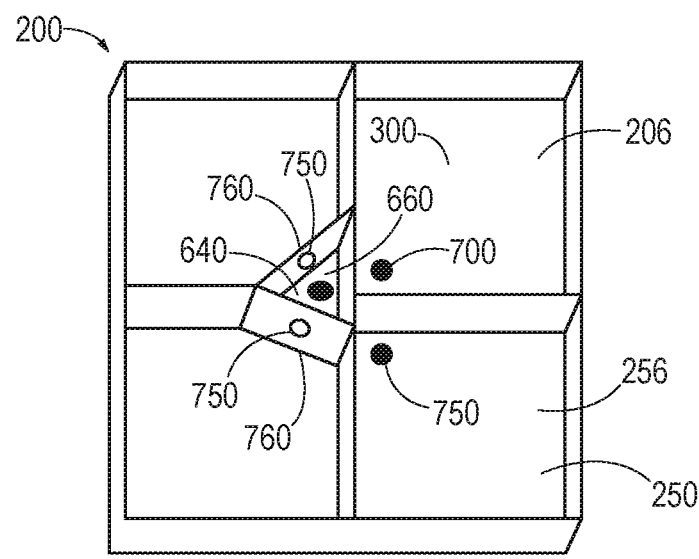
FIG. 6 is a diagram of an example apparatus that includes a storage chamber and multiple additional storage chambers.

FIGS. 4-6 illustrate example storage chambers for a heat transfer device 100 according to the present disclosure, in which the barrier device comprises a burst disc or membrane. For example, FIG. 4 illustrates an example cylindrical storage chamber 200 in which the barrier element 700 is a burst disc or membrane centrally located within the storage chamber 200. According to the present disclosure, when at least one of (i) the temperature of the coolant 300 reaches a trigger temperature, and (ii) the pressure of the coolant 300 stored in the storage chamber 200 reaches a threshold pressure, the barrier element 700 ruptures and/or otherwise allows the coolant 300 to flow into an associated enclosed cooling volume via a fluid passage 600.

FIG. 5 illustrates an example storage chamber 200 having a polygonal prism shape, and in which the barrier element 700 is a burst disc or membrane that is not centrally located within the storage chamber 200. When in the open configuration, coolant 300 stored in the enclosed storage volume 206 flows into the fluid passage 600. The coolant 300 may then flow into an associated enclosed cooling volume 406 by passing through a through hole 408. FIG. 5 further illustrates fluid chamber 640 as including a catch 642 that is configured to physically prevent debris from traveling through the through hole 408 with the flow of coolant 300.

FIG. 6 illustrates an example apparatus that includes a storage chamber 200 and multiple additional storage chambers 250. For example, FIG. 6 illustrates an apparatus that includes an enclosed storage volume 206 that stores coolant 300, and multiple additional storage chambers 250 that store additional coolant 350. FIG. 6 also shows the apparatus including a barrier element 700 and multiple additional barrier elements 750. FIG. 6 also shows multiple barrier elements 760 that, when in an open configuration, each allow additional coolant to flow into a shared fluid passage 660 that comprises a fluid chamber 640.

Figure 8:
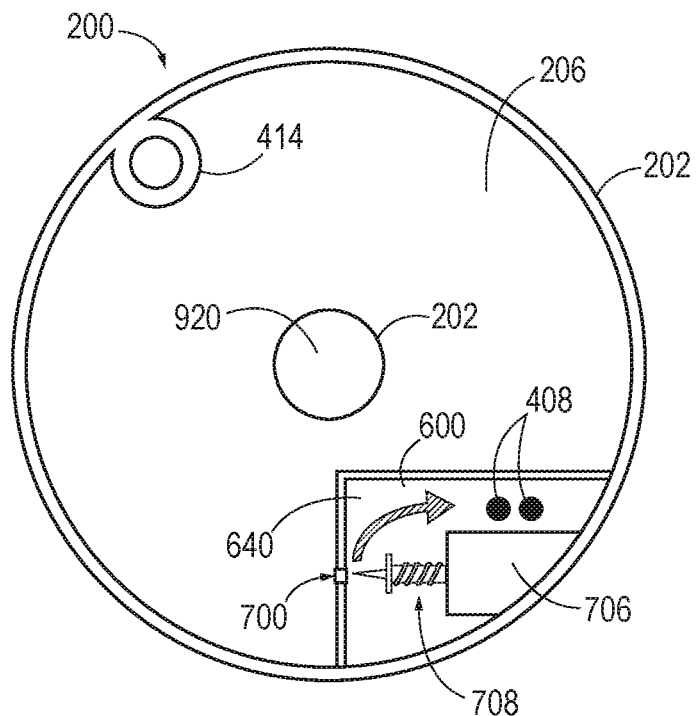
FIG. 8 is a diagram of an example storage chamber in which the barrier device includes a plunger device, and including a chimney.
Figure 9:
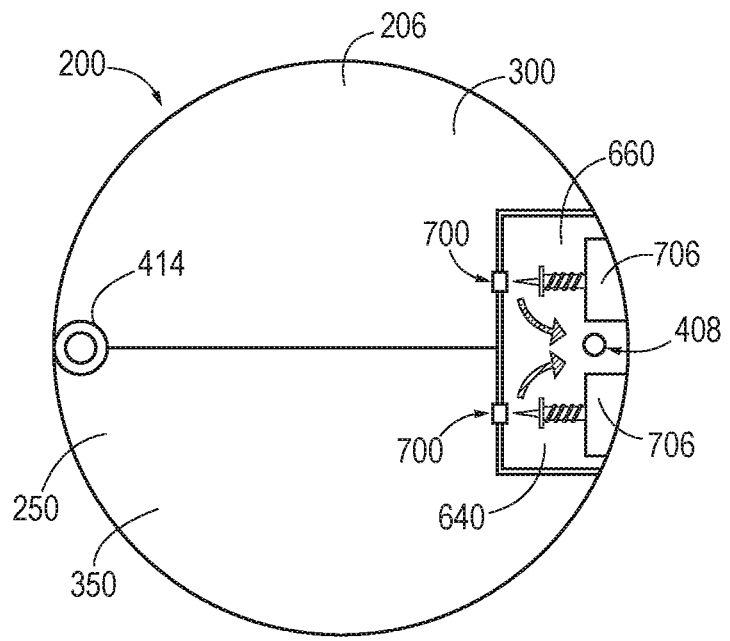
FIG. 9 is a diagram of an example apparatus that includes a storage chamber and an additional storage chamber.

FIGS. 7-9 illustrate example storage chambers for a heat transfer device 100 according to the present disclosure, in which the barrier device comprises a plunger device. For example, FIG. 7 illustrates an example cylindrical storage chamber 200 in which the barrier element 700 includes a plunger device 706. According to the present disclosure, when at least one of (i) the temperature of the coolant 300 reaches a trigger temperature, and (ii) the pressure of the coolant 300 stored in the storage chamber 200 reaches a threshold pressure, the plunger device 706 actuates the puncturing needle 708 so that the puncturing end 710 creates a rupture in a burst disc 702 or other barrier. Coolant 300 is then able to flow through the rupture and into the fluid passage 600. The coolant 300 may then pass into the enclosed cooling volume 406 via the through hole 408.

As schematically illustrated in FIG. 7, the plunger device 706 optionally may include a pressure tab that is configured to burst when a pressure exerted on the pressure tab exceeds a threshold value, or when the temperature of the pressure tab exceeds a threshold value. In another example, the plunger device 706 may include a restraining element 740 that prevents the plunger device 706 from moving to a neutral position, wherein the plunger device 706 moving to the neutral position includes creating the passage through which the coolant 300 is able to flow from the enclosed storage volume 206 to the fluid passage 600.

FIG. 8 illustrates an example storage chamber 200 in which the barrier element 700 includes a plunger device 706, and including a chimney 414. The example storage chamber 200 shown in FIG. 8 also includes an opening 920 defined by the storage housing 202. The opening 920 may allow a line of sight through the storage chamber 200. In some embodiments, the storage chamber 200 and the cooling chamber 400 may include opening 920 so that a line of sight exists through the storage chamber 200 and cooling chamber 400 such that at least a portion of the heat source 102 and/or other surface to which the heat transfer device 100 is attached is made visible. FIG. 8 also illustrates fluid passage 600 including multiple through holes 408, and a chimney 414 that allows the coolant 300 to flow from the enclosed cooling volume and through the enclosed storage volume 206 and/or one or more other components of the heat transfer device 100.

FIG. 9 illustrates an example apparatus that includes a storage chamber 200 and additional storage chambers 250. Specifically, FIG. 9 illustrates an apparatus that includes multiple barrier elements 700 (i.e., plunger devices 706) that each, when in an open configuration, allow coolant 300 or 350 to flow into a shared fluid passage 660 and through hole 408. FIG. 9 also illustrates a chimney 414 that allows the coolant 300 or 350 to flow from the enclosed cooling volume and through the enclosed storage volume 206 and/or one or more other components of the heat transfer device 100.

Figure 10:
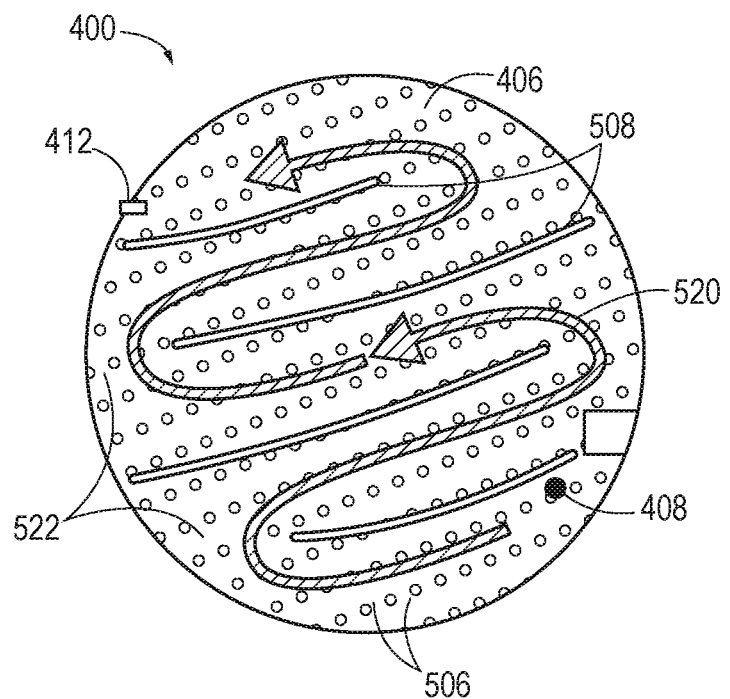
FIG. 10 is a diagram of an example cylindrical cooling chamber with a single coolant flow path and multiple switchbacks.

FIGS. 10-14 illustrate example cooling chambers for a heat transfer device 100 according to the present disclosure. For example, FIG. 10 illustrates an example cylindrical cooling chamber 400 with a single coolant flow path 520 and multiple switchbacks 522. Coolant 300 may enter the enclosed cooling volume 406 via the through hole 408, and may be directed by vanes 508 to flow along the coolant flow path 520. FIG. 10 also illustrates an offset matrix array of pins 506. In various embodiments, individual vanes 508 may have a constant width, a varying width, a constant height, a varying height, may be perpendicular to an associated surface of the cooling housing 402, may have a camber angle between the individual vane 508 and the associated surface of the cooling housing 402, or a combination thereof. One or more of the vanes 508 and pins 506 may be configured to allow heat to transfer from a heat source 102 and into the coolant 300 as the coolant 300 flows along the coolant flow path 520. FIG. 10 also illustrates an exit interface 412 through which the coolant 300, as well as any heat absorbed by the coolant during its traversal of the coolant flow path 520, may flow out of the enclosed cooling volume 406.

Figure 11:
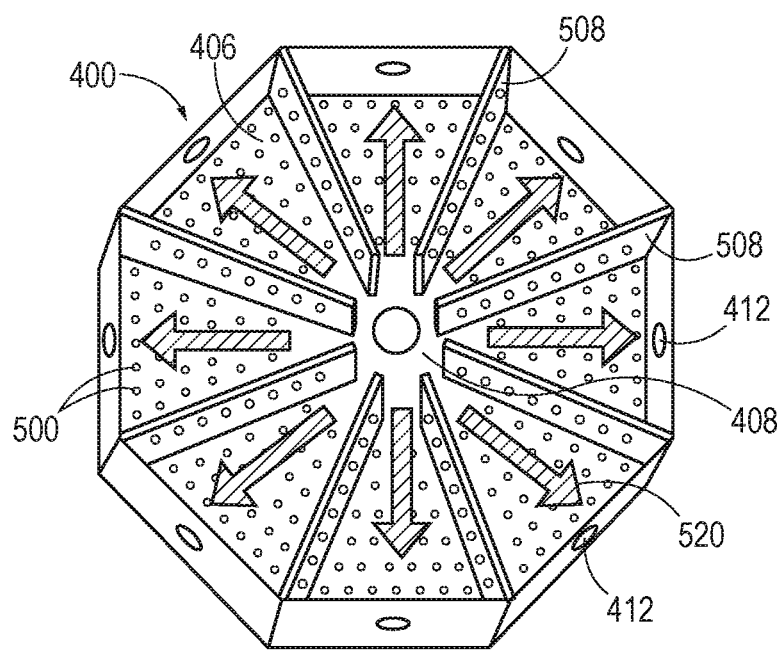
FIG. 11 is a diagram of an example cooling chamber with multiple coolant flow paths extending radially outward from a through hole.

FIG. 11 illustrates an example cooling chamber 400 with multiple coolant flow paths extending radially outward from a through hole. Coolant may enter the enclosed cooling volume via the through hole 408, and may flow radially outward along one of the coolant flow paths 520 defined by vanes 508. FIG. 11 also illustrates a plurality of heat transfer components 500 arranged in a matrix array, configured to allow heat to transfer from a heat source 102 and into the coolant 300 as the coolant 300 flows along the coolant flow paths 520. FIG. 11 also illustrates multiple exit interfaces 412 through which the coolant 300, as well as any heat absorbed by the coolant during its traversal of the coolant flow path 520, may flow out of the enclosed cooling volume 406.

Figure 12:
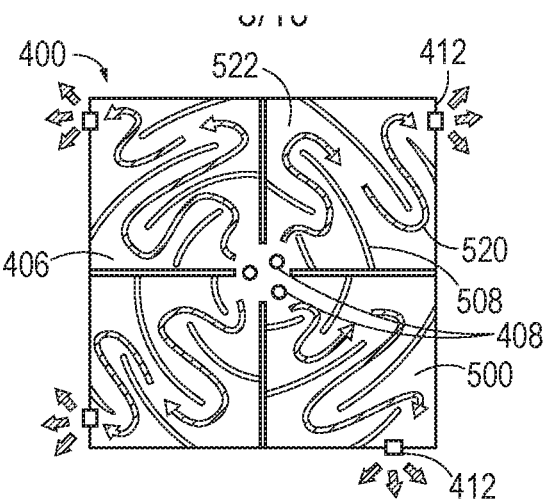
FIG. 12 is a diagram of an example cylindrical cooling chamber with multiple coolant flow paths having switchbacks.

FIG. 12 illustrates an example cooling chamber 400 with multiple coolant flow paths 520 having switchbacks 522. Coolant may enter the enclosed cooling volume via the multiple through holes 408, and may flow along one of the coolant flow paths 520 defined by the vanes 508. FIG. 12 further shows a portion 416 of the cooling housing 402 as comprising a conductive material that distributes heat from the heat source 102 to the coolant 300 as it flows along the coolant flow paths 520. FIG. 12 also illustrates multiple exit interfaces 412 through which the coolant 300, as well as any heat absorbed by the coolant during its traversal of the coolant flow path 520, may flow out of the enclosed cooling volume 406.

Figure 13:
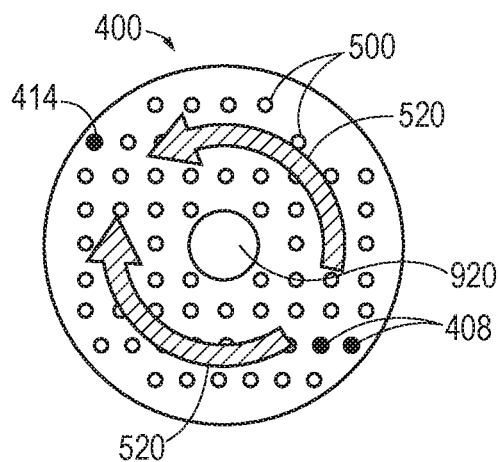
FIG. 13 is a diagram of an example cylindrical cooling chamber with two coolant flow paths and an opening.

FIG. 13 illustrates an example cylindrical cooling chamber 400 with two coolant flow paths 520 and an opening 920. Coolant may enter the enclosed cooling volume via the multiple through holes 408, and may flow along one of the two coolant flow paths 520 to chimney 414. FIG. 13 also illustrates a plurality of heat transfer components 500 arranged in a matrix array. The example cooling chamber 400 shown in FIG. 13 also includes an opening 920 defined by the cooling housing 402 that allows a line of sight through the cooling chamber 400.

Figure 14:
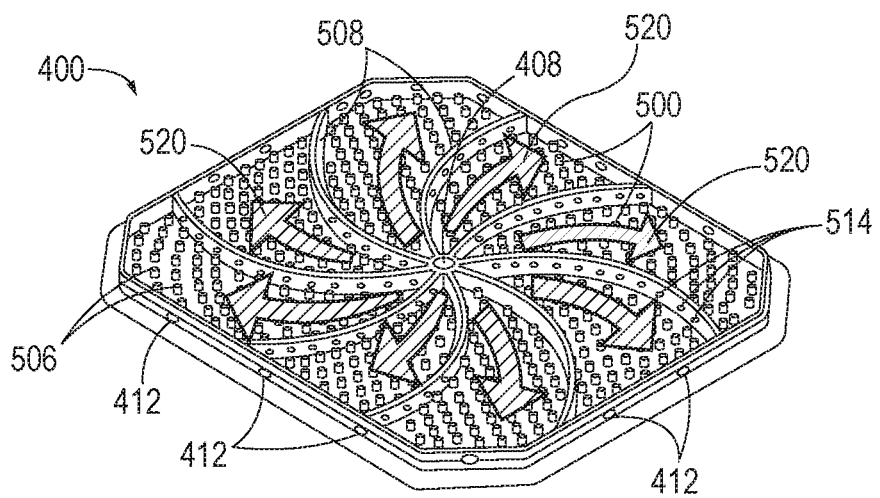
FIG. 14 is a diagram of an example cooling chamber with multiple curved coolant flow paths extending radially outward from a through hole.

FIG. 14 illustrates an example cooling chamber 400 with multiple curved coolant flow paths extending radially outward from a through hole. Coolant 300 may enter the enclosed cooling volume via the through hole 408, and may flow radially outward along one of the curved coolant flow paths 520 defined by curved vanes 508. In FIG. 14 the coolant 300 enters the enclosed cooling volume at a central distribution location that is designed to allow the coolant 300 to flow through each of the multiple curved coolant flow paths. Thus, as the coolant 300 flows into the central distribution location, the coolant 300 is pushed outward from the central distribution location and into each of the multiple curved coolant flow paths. As shown in FIG. 14, the coolant flow paths 520 defined by the vanes 508 may expand the farther they are from the through hole 408. FIG. 14 also illustrates a plurality of heat transfer components 500 (i.e., pins 506) arranged in a matrix array, configured to allow heat to transfer from a heat source 102 and into the coolant 300 as the coolant 300 flows along the coolant flow paths 520. FIG. 14 also illustrates multiple exit interfaces 412 through which the coolant 300, as well as any heat absorbed by the coolant during its traversal of the coolant flow path 520, may flow out of the enclosed cooling volume 406.

FIG. 14 further shows an exploded view of a portion of example cooling chamber 400 that indicates the flow of coolant 300 within individual curved coolant flow paths and through vanes 508. Specifically, the exploded view shows coolant 300 flowing outward within the coolant flow paths 520. Additionally, the exploded view illustrates coolant 300 flowing through the cutouts 514 in vane 508. In this way, because the coolant 300 is allowed to flow between different coolant flow paths 520 through cutouts 514, the temperatures of the coolant 300 and heat transfer components 500 can be uniform across the cooling chamber 400. The vanes 508 are illustrated in exploded view as including circular cutouts 514 that are configured to allow the coolant 300 to flow through the vanes 508. However, according to the present disclosure the cutouts 514 may be otherwise distributed, sized, and/or shaped including diamond, Vesica Pisces and/or other shapes. For example, in some embodiments, the cutouts 514 may be distributed, sized, and/or shaped within the vanes 508 so that the flow rate of coolant 300 through each cutout 514 is constant for all cutouts 514. Additionally, in some embodiments, one or more of vanes 508 may be hollow and/or include internal pathways. In this way, the coolant 300 may travel internally within the hollow vanes 508, internal pathways, and/or through the cutouts 514 as the coolant 300 travels outwardly from the center of the cooling chamber 400.

Figure 15:
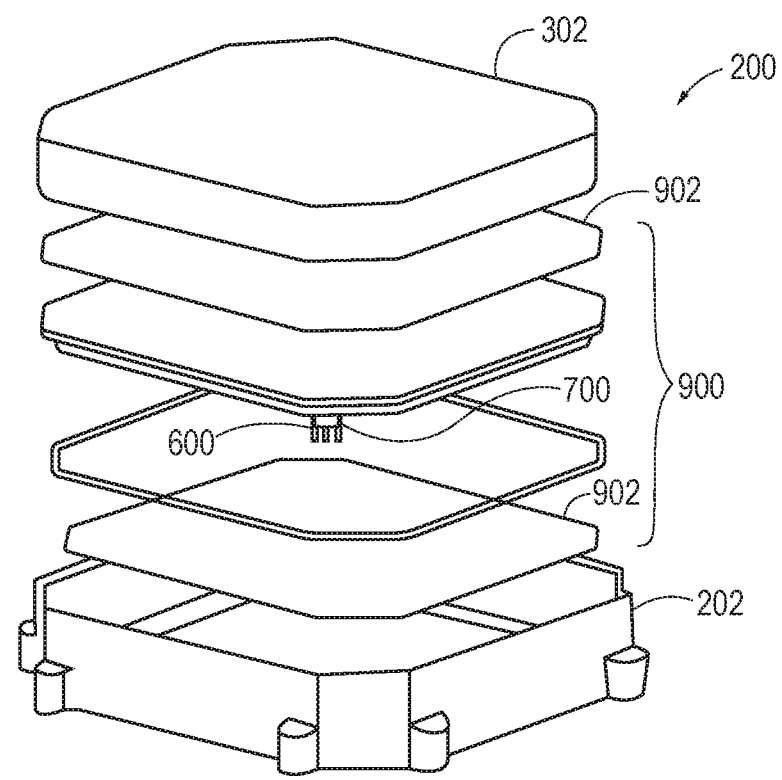
FIG. 15 is an exploded view of an example heat transfer device according to the present disclosure.
Figure 15:
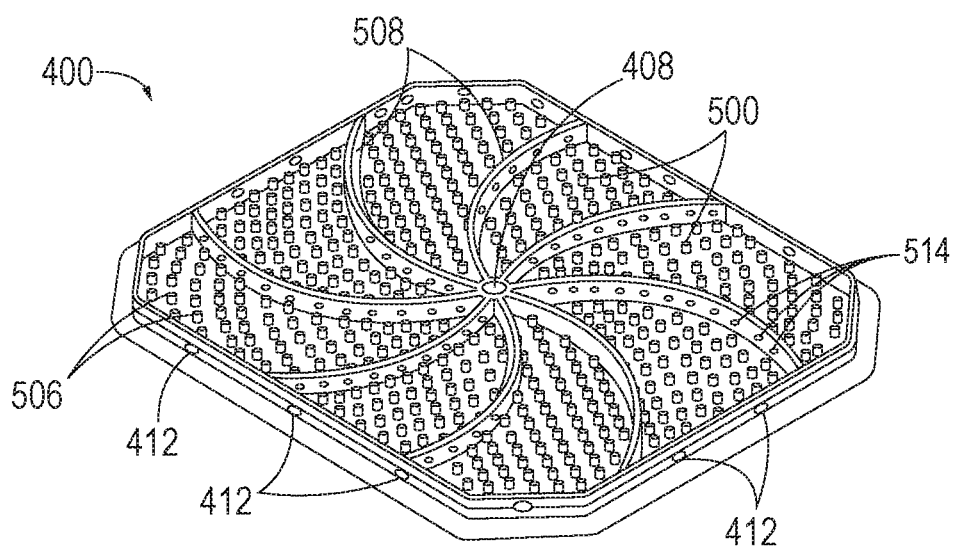

FIG. 15 is an exploded view of an example heat transfer device according to the present disclosure. Specifically, FIG. 15 illustrates component elements of a storage chamber 200 partially defined by storage housing 202 and configured to store a coolant and a heat distribution element 302 configured to distribute heat across the coolant 300. FIG. 15 also illustrates a barrier 900 between the storage chamber 200 and the cooling chamber 400 that comprises a heat transfer component 500, such as a conductive film, coating, layer and/or other barrier structure that partially or completely separates the enclosed cooling volume 406 from the enclosed storage volume. For example, in the example depicted in FIG. 15, barrier 900 includes one or more of a braze foil 902, a parting sheet with fin array, and/or other conductive components that are configured to allow heat to transfer into the cooling chamber 400 and/or evenly distribute the heat across the barrier 900. In some embodiments, the storage housing 202 and/or barrier 900 may include one or more seals, such as a Gibbous O-ring Layering seal that prevents the coolant from leaking from the enclosed storage chamber 200. FIG. 15 also shows the example heat transfer device as including a barrier element 700 and fluid passage 600. In its exploded view, FIG. 15 also shows the example heat transfer device as including the example cooling chamber 400 depicted in FIG. 14.

Figure 16:
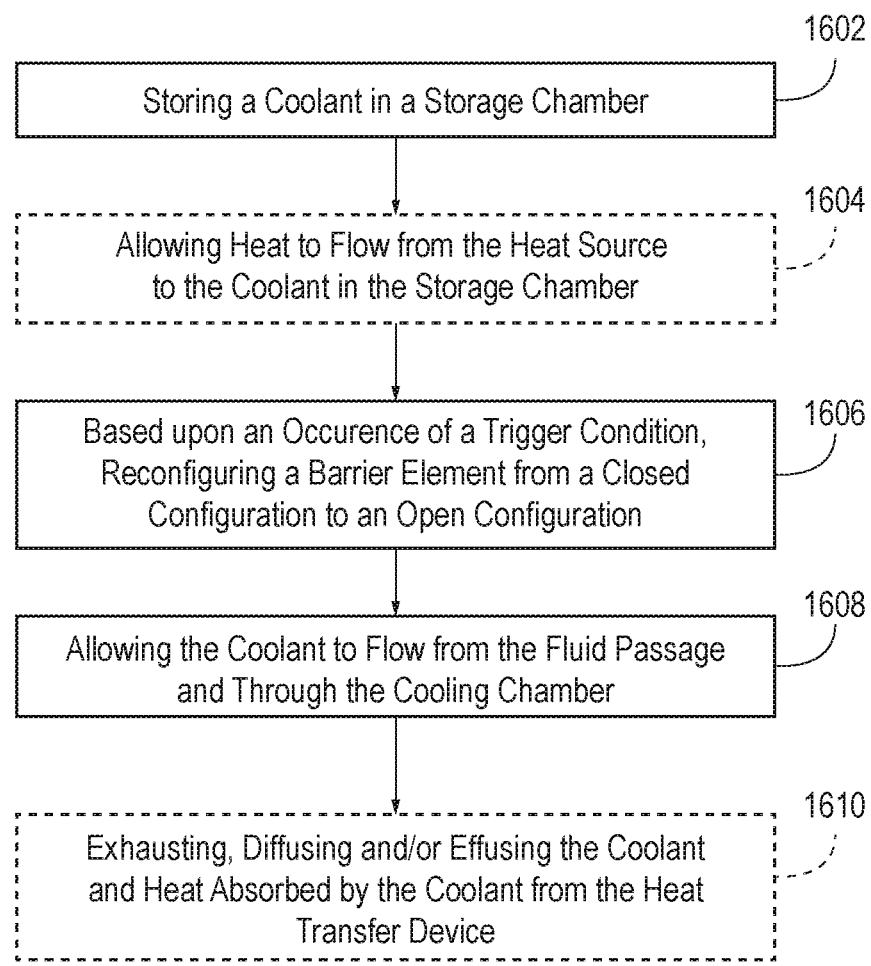
FIG. 16 is a flowchart schematically representing methods for cooling a heat source using a heat transfer device according to the present disclosure.

FIG. 16 schematically provides a flowchart that represents illustrative, non-exclusive examples of methods according to the present disclosure. In FIG. 16, some steps are illustrated in dashed boxes indicating that such steps may be optional or may correspond to an optional version of a method according to the present disclosure. That said, not all methods according to the present disclosure are required to include the steps illustrated in solid boxes. The methods and steps illustrated in FIG. 16 are not limiting and other methods and steps are within the scope of the present disclosure, including methods having greater than or fewer than the number of steps illustrated, as understood from the discussions herein.

FIG. 16 is a flowchart depicting methods 1600, according to the present disclosure, for cooling a heat source using a heat transfer device 100. Methods 1600 include storing a coolant (e.g., coolant 300) in a storage chamber (e.g., storage chamber 200) at 1602. For example, the storage chamber may include an enclosed volume (e.g., enclosed storage volume 206) that is defined by a housing of the storage chamber. The coolant may include any substance capable of efficiently absorbing heat, and which within normal operating conditions is able to flow from the storage chamber to the cooling chamber through the fluid passage. The coolant 300 may be a liquid at normal operating conditions of the heat transfer device 100.

Methods 1600 optionally may include allowing heat to transfer from the heat source (e.g., heat source 102) to the coolant stored in the storage chamber at 1604. For example, heat may transfer from the heat source to the coolant through components configured to facilitate heat transfer (e.g., the heat transfer components 500, the storage housing 202, the cooling housing 402, the storage heat transfer component 516, etc.), by another heat transfer means, such as radiation and/or other environmental conductors located proximate to the heat transfer device 100 and/or heat source, or a combination thereof.

At 1606, a barrier element reconfigures from (i) a closed configuration in which the barrier element is configured to restrict the coolant from flowing from the storage chamber through the fluid passage, and to (ii) an open configuration in which the barrier element is configured to allow the coolant in the storage chamber to flow from the storage chamber through the fluid passage. In some embodiments, the barrier element may reconfigure from the closed configuration to an open configuration based upon an occurrence of a trigger condition. The trigger condition may include at least one of the coolant reaching a trigger temperature, and/or the coolant reaching a trigger pressure. In some embodiments, the barrier element may passively reconfigure from the closed configuration to an open configuration in response to the trigger condition. For example, the barrier element may include one or more of a burst disc, a membrane, a plunger device, a release valve, a pressure release valve, a check valve, a pyrotechnic valve, a solenoid valve, a ball and spring valve, etc., that passively transition from the closed configuration to the open configuration responsive to the trigger condition.

At 1608, the coolant is allowed to flow from the fluid passage and through the cooling chamber, wherein while the coolant flows through the cooling chamber heat is transferred from the heat source and to the coolant via one or more heat transfer components. For example, responsive to the barrier element being in an open configuration, the coolant may flow into the cooling chamber via the fluid chamber. In some embodiments, the coolant flows from the storage chamber and into the fluid passage at an initial pressure, and flows out of the fluid passage toward a cooling chamber at a final pressure that is less than the initial pressure. In some embodiments, the fluid passage includes an expansion valve through which the coolant flows when it passes through the fluid passage. As the coolant flows through the cooling chamber along one or more coolant flow paths, heat from the heat source flows into the coolant. For example, the cooling chamber may include one or more heat transfer components configured to allow heat to transfer between a heat source and the coolant, such as conductive pins, vanes, rods, fins, or other structures. In some embodiments, some or all of the conductive elements define the coolant flow path(s).

At 1610, the coolant and the heat from the heat source absorbed by the coolant are exhausted from the heat transfer device. For example, the cooling chamber may include at least one exit interface through which the coolant, as well as any heat absorbed by the coolant during its traversal of the coolant flow path, may flow out of the enclosed cooling volume.

Illustrative, non-exclusive examples of inventive subject matter according to the present disclosure are described in the following enumerated paragraphs:

A1. A heat transfer device, comprising: a storage chamber; a coolant housed within the storage chamber at an initial pressure; a cooling chamber adjacent to the storage chamber; one or more heat transfer components positioned and configured to facilitate heat transfer from a heat source distinct from the cooling chamber to the cooling chamber; a fluid passage between the storage chamber and the cooling chamber; and a barrier element having (i) a closed configuration in which the barrier element is configured to restrict the coolant from flowing from the storage chamber through the fluid passage and into the cooling chamber, and (ii) an open configuration in which the barrier element is configured to permit the coolant in the storage chamber to flow from the storage chamber through the fluid passage and into the cooling chamber, wherein the barrier element is configured to reconfigure from the closed configuration to the open configuration in response to a trigger condition, wherein the trigger condition includes at least one of: the coolant housed within the storage chamber reaching a trigger temperature, and the initial pressure of the coolant housed within the storage chamber reaching a trigger pressure.

A2. The heat transfer device of paragraph A1, wherein the fluid passage is configured to expand the coolant from the initial pressure to an expanded pressure as the coolant flows from the storage chamber through the fluid passage and to the cooling chamber responsive to the barrier element reconfiguring from the closed configuration to the open configuration.

A3. The heat transfer device of any of paragraphs A1-A2, wherein the fluid passage comprises an expansion valve coupled to the storage chamber and the cooling chamber such that the coolant flows from the storage chamber and into the expansion valve at the initial pressure, and flows out of the expansion valve toward the cooling chamber at the expanded pressure, wherein the initial pressure is greater than the expanded pressure.

A4. The heat transfer device of paragraph A3, wherein the expansion valve defines the fluid passage.

B1. The heat transfer device of any of paragraphs A1-A4, wherein the storage chamber is an enclosed storage volume.

B1.1. The heat transfer device of paragraph B1, further comprising a storage housing, and wherein the storage housing defines the enclosed storage volume.

B1.2. The heat transfer device of any of paragraphs B1-B1.1, wherein the enclosed storage volume is cylindrical.

B1.3. The heat transfer device of any of paragraphs B1-B1.1, wherein the enclosed storage volume is a rectangular prism.

B2. The heat transfer device of any of paragraphs A1-B1.3, wherein the cooling chamber includes a first side that is proximate to the heat source and a second side that is opposite the first side, and wherein the storage chamber is located proximate to the second side.

B3. The heat transfer device of any of paragraphs A1-B2, wherein the coolant has a boiling point temperature that is greater than a range of operating temperatures of the heat transfer device.

B4. The heat transfer device of any of paragraphs A1-B3, wherein the coolant has a freezing point temperature that is less than a/the range of operating temperatures of the heat transfer device.

B5. The heat transfer device of any of paragraphs A1-B4, wherein the coolant has a phase change temperature that is within a range of operating temperatures of the heat transfer device.

B6. The heat transfer device of any of paragraphs A1-B5, wherein the coolant comprises, and optionally is or consists of, methane.

B7. The heat transfer device of any of paragraphs A1-B6, wherein the coolant comprises a fire retardant.

B8. The heat transfer device of any of paragraphs A1-B7, wherein the coolant housed within the storage chamber is in a liquid state.

B8.1. The heat transfer device of paragraph B8, wherein the coolant flowing through the fluid passage causes the coolant to transition from the liquid state to a gaseous state.

B9. The heat transfer device of any of paragraphs A1-B8, further comprising a heat distribution element located within the storage chamber and configured to distribute the heat across the coolant.

B9.1. The heat transfer device of paragraph B9, wherein the heat distribution element is an aluminum foam.

B10. The heat transfer device of any of paragraphs A1-B9, wherein the storage chamber is configured to store the coolant for a long period of time and/or through regimes/varieties of environmental conditions B11. The heat transfer device of any of paragraphs A1-B10, wherein the coolant remains stable in storage for a long period of time and/or through regimes/varieties of environmental conditions.

B12. The heat transfer device of any of paragraphs A1-B11, further comprising: an additional storage chamber; additional coolant housed within the additional storage chamber, and an additional fluid passage between the additional storage chamber and the cooling chamber; and an additional barrier element having (i) a closed configuration in which the additional barrier element is configured to restrict the additional coolant from flowing from the additional storage chamber through the additional fluid passage and into the cooling chamber, and (ii) an open configuration in which the additional barrier element is configured to allow the additional coolant in the additional storage chamber to flow from the additional storage chamber through the additional fluid passage and into the cooling chamber.

B.12.1. The heat transfer device of any of paragraphs A1-B11, further comprising: an additional storage chamber; additional coolant housed within the additional storage chamber, and the fluid passage is further configured to allow coolant to flow between the additional storage chamber and the cooling chamber; and an additional barrier element having (i) a closed configuration in which the additional barrier element is configured to restrict the additional coolant from flowing from the storage chamber through the fluid passage and into the cooling chamber, and (ii) an open configuration in which the additional barrier element is configured to allow the additional coolant in the additional storage chamber to flow from the additional storage chamber through the fluid passage and into the cooling chamber.

B12.2. The heat transfer device of any of paragraphs B12 and B12.1, wherein the additional barrier element is configured to reconfigure from the closed configuration to the open configuration in response to an additional trigger condition.

B12.3. The heat transfer device of paragraph B12.2, wherein the additional trigger condition includes at least one of: the additional coolant housed within the additional storage chamber reaching an additional trigger temperature; and the initial pressure of the additional coolant housed within the additional storage chamber reaching an additional trigger pressure.

B12.4. The heat transfer device of any of paragraphs B12-B12.3, wherein a/the additional trigger condition is different from the trigger condition.

B12.5. The heat transfer device of any of paragraphs B12-B12.4, wherein the additional fluid passage is configured to expand the additional coolant from the initial pressure to an expanded pressure as the additional coolant flows from the additional storage chamber through the additional fluid passage and to the cooling chamber responsive to the additional barrier element reconfiguring from the closed configuration to the open configuration.

C1. The heat transfer device of any of paragraphs A1-B12.5, wherein heat is transferred from the heat source and to the coolant stored within the storage chamber.

C1.1. The heat transfer device of paragraph C1, wherein at least one of the one or more heat transfer components is configured to allow heat to transfer between the heat source, the cooling chamber, and the coolant in the storage chamber.

C1.2. The heat transfer device of any of paragraphs C1-C1.1, further comprising a storage heat transfer component configured to allow heat to transfer between the heat source and the coolant in the storage chamber.

C2. The heat transfer device of any of paragraphs A1-C1, wherein as the heat is transferred from the heat source and to the coolant, the pressure of the coolant in the storage chamber increases.

C3. The heat transfer device of any of paragraphs A1-C2, wherein the pressure of the coolant in the storage chamber is a driving pressure that forces the coolant in the storage chamber to flow through the fluid passage and into the cooling chamber.

C4. The heat transfer device of paragraph C3, wherein heat continues to flow from the heat source to the coolant housed within the storage chamber when the barrier element is in the open configuration, and wherein the heat continuing to flow to the coolant generates additional driving pressure that forces the coolant in the storage chamber to flow through the fluid passage and into the cooling chamber.

D1. The heat transfer device of any of paragraphs A1-C4, wherein the barrier element is configured to passively transition from the closed configuration to the open configuration in response to the trigger condition.

D2. The heat transfer device of any of paragraphs A1-D1, wherein the barrier element comprises a closed circuit that is configured to cause the barrier element to transition from the closed configuration to the open configuration in response to the trigger condition.

D2.1. The heat transfer device of paragraph D2, wherein the closed circuit includes one or more of a temperature sensor and/or a pressure sensor.

D2.2. The heat transfer device of paragraph D2.1, wherein the temperature sensor and/or the pressure sensor comprises a thermal couple and/or a strain gauge.

D3. The heat transfer device of any of paragraphs A1-D2.2, wherein the barrier element comprises a burst disc that is configured to rupture when the coolant reaches the trigger temperature and/or the pressure of the coolant in the storage chamber reaches the trigger pressure.

D4. The heat transfer device of any of paragraphs A1-D2.2 wherein the barrier element comprises a plunger that is configured to, when the trigger condition occurs, create a passage that the coolant can flow through.

D.4.1. The heat transfer device of paragraph D4, wherein the barrier element comprises a burst disc, and creating the passage that the coolant can flow through comprises the plunger rupturing the burst disc.

D4.2. The heat transfer device of paragraph D4, wherein the plunger includes a pressure tab that is configured to burst when the coolant reaches the trigger temperature and/or the pressure of the coolant in the storage chamber reaches the trigger pressure, and wherein the pressure tab bursting causes the plunger to create the passage.

D4.3. The heat transfer device of any of paragraphs D4-D4.2, wherein the plunger includes a restraining element that prevents the plunger from creating the passage, and wherein the restraining element is configured to melt when the coolant reaches the trigger temperature.

D4.3.1. The heat transfer device of paragraph D4.3, wherein the melting of the restraining element causes the plunger to rupture the burst disc and/or puncture a barrier (e.g., thin wall and/or wall with counter-sink).

D4.4. The heat transfer device of any of paragraphs A1-D4.3, wherein the plunger is further configured to plug the passage when a close condition occurs.

D4.4.1. The heat transfer device of paragraph D4.4, wherein the close condition corresponds to one of a closing pressure and a closing temperature.

D5. The heat transfer device of any of paragraphs A1-D2.2, wherein the barrier element comprises a membrane configured to: restrict the coolant from flowing across the membrane when the pressure of the coolant in the storage chamber is below a threshold pressure; and allow the coolant to flow across the membrane when the pressure of the coolant in the storage chamber is greater than or equal to the threshold pressure.

D6. The heat transfer device of any of paragraphs A1-D2.2, wherein the barrier element comprises one or more of a release valve, a pressure release valve, and a check valve.

D7. The heat transfer device of any of paragraphs A1-D6, wherein after the occurrence of the trigger condition, the coolant flowing from the storage chamber through the fluid passage and into the cooling chamber causes the pressure of the coolant in the storage chamber to decrease.

D7.1. The heat transfer device of paragraph D7, wherein as the pressure of the coolant in the storage chamber decreases, a mass flow rate of the coolant out of the storage chamber decreases correspondingly.

D8. The heat transfer device of any of paragraphs A1-D7.1, wherein after the occurrence of the trigger condition, heat from the heat source continues to warm the coolant within the storage chamber.

D9. The heat transfer device of any of paragraphs A1-D8, wherein after the occurrence of the trigger condition, a/the continued warming of the coolant within the storage chamber causes the pressure of the coolant in the storage chamber to increase.

E1. The heat transfer device of any of paragraphs A1-D9, wherein the fluid passage is a Joule-Thomson device that is configured to bring the coolant from a high pressure to a low pressure when the coolant flows from the storage chamber to the cooling chamber via the fluid passage.

E2. The heat transfer device of any of paragraphs A1-E1, wherein the fluid passage includes an expansion valve configured to cause the coolant to be converted from a liquid to a gas when the coolant flows from the storage chamber to the cooling chamber via the expansion valve.

E3. The heat transfer device of paragraph E2, wherein the coolant is a low quality gas after the coolant flows from the storage chamber to the cooling chamber via the expansion valve.

E4. The heat transfer device of any of paragraphs A1-E3, wherein the coolant flows from the storage chamber and into the fluid passage at an initial temperature, and flows out of the fluid passage toward the cooling chamber at a final temperature, wherein the initial temperature is greater than the final temperature.

F1. The heat transfer device of any of paragraphs A1-E4, wherein the cooling chamber is an enclosed cooling volume.

F1.1. The heat transfer device of paragraph F1, further comprising a storage housing, and wherein the storage housing defines the enclosed cooling volume.

F1.2. The heat transfer device of any of paragraphs F1-F1.1, wherein the enclosed cooling volume is cylindrical.

F1.3. The heat transfer device of any of paragraphs F1-F1.1, wherein the enclosed cooling volume is a rectangular prism.

F2. The heat transfer device of any of paragraphs A1-F1.3, wherein the one or more heat transfer components include at least one of pins, vanes, rods, fins, or other structures configured to allow heat to transfer between a heat source and the cooling chamber.

F3. The heat transfer device of any of paragraphs A1-F2, wherein as the coolant flows through the enclosed cooling volume, heat is transferred from the one or more heat transfer components to the coolant.

F3.1. The heat transfer device of paragraph F3, wherein the coolant gaining heat from the one or more heat transfer components corresponds to heat being drawn away from the heat source.

F3.2. The heat transfer device of any of paragraphs F3-F3.1, wherein the one or more heat transfer components include a plurality of sponge rods distributed within a/the enclosed cooling volume.

F4. The heat transfer device of any of paragraphs A1-F3.2, wherein the one or more heat transfer components are further configured to direct the flow of coolant within a/the enclosed cooling volume.

F5. The heat transfer device of any of paragraphs F1.1-F4, wherein the fluid passage includes a through hole defined by the storage housing, wherein the through hole is configured to allow coolant to flow into the cooling chamber.

F5.1. The heat transfer device of any of paragraphs A1-F5, wherein the one or more heat transfer components include an inner heat transfer component that is located near the through hole, and an outer heat transfer component that is located further from the through hole than the inner heat transfer component, and wherein a size of the outer heat transfer component is greater than a size of the inner heat transfer component.

F6. The heat transfer device of any of paragraphs A1-F5, further comprising one or more vanes configured to direct the flow of coolant within a/the enclosed cooling volume.

F6.1. The heat transfer device of paragraph F6, wherein the vanes are further configured to allow heat to transfer between a heat source and the cooling chamber.

F6.2. The heat transfer device of any of paragraphs F6-F6.1, wherein the vanes include cutouts that are configured to allow the coolant to flow through the vanes.

F7. The heat transfer device of any of paragraphs A1-F6.2, wherein the pins and vanes are positioned within the enclosed cooling volume to ensure that the coolant is able to flow through the enclosed cooling volume.

F7.1. The heat transfer device of paragraph F7, wherein the one or more heat transfer components define a path for the coolant to flow within the enclosed cooling volume.

F7.1.1. The heat transfer device of paragraph F7.1, wherein the path includes one or more switchbacks.

F7.1.2. The heat transfer device of any of paragraphs F7.1-F7.1.1, wherein the one or more heat transfer components define a plurality of paths for the coolant to flow within the enclosed cooling volume.

F7.1.3. The heat transfer device of paragraph F7.1.2, wherein individual paths of the plurality of paths lead radially and/or symmetrically-radially outward from a/the expansion valve.

F7.2. The heat transfer device of any of paragraphs F7-F7.1, wherein when the coolant in the enclosed cooling volume reaches the end of the path, the coolant is exhausted from the enclosed cooling volume.

F7.2.1. The heat transfer device of paragraph 7.2, further comprising one or more exit interfaces that enable coolant to flow from the enclosed cooling volume to an exhaustion, diffusion, and/or effusion region, and wherein exhausting the coolant from the enclosed cooling volume comprises the coolant flowing through the one or more exit interfaces and to the exhaustion, diffusion, and/or effusion region.

F7.2.2. The heat transfer device of paragraph 7.2.1, wherein the exhaustion region is the environment of the heat transfer device.

F7.2.3. The heat transfer device of paragraph 7.2, further comprising a chimney through which coolant is able to flow from the enclosed cooling volume to an exhaustion, diffusion, and/or effusion region, and where exhausting the coolant from the enclosed cooling volume comprises the coolant flowing through the chimney and to the exhaustion, diffusion, and/or effusion region.

F8. The heat transfer device of any of paragraphs A1-F7.2.2, wherein the one or more heat transfer components are added to the enclosed cooling volume using additive manufacturing.

F9. The heat transfer device of any of paragraphs A1-F8, wherein the one or more heat transfer components include functionally gradient materials.

F10. The heat transfer device of any of paragraphs A1-F9, wherein a thermal expansion of the one or more heat transfer components decreases the volume of a/the enclosed storage volume.

F11. The heat transfer device of any of paragraphs A1-F10, wherein the coolant flows into the cooling chamber from the storage chamber at a central location of the enclosed cooling volume.

F.11.1. The heat transfer device of any of paragraphs A1-F11, wherein a compression of the enclosed volume contributes to and/or is the sole source of an increase in internal pressure of the enclosed volume.

F.11.2. The heat transfer device of any of paragraphs A1-F11.1, wherein the compression of the enclosed volume contributes to and/or is the sole activating force that causes the barrier element reconfiguring from the closed configuration to the open configuration in response to a trigger condition.

F.11.3. The heat transfer device of any of paragraphs A1-F11.2, wherein the compression of the enclosed volume contributes to and/or is the sole driver of the coolant through the cooling chamber.

F12. The heat transfer device of any of paragraphs A1-F11, wherein the heat source is one of an electronic device and an electronic component.

G1. A combination of the heat transfer device of any of paragraphs A1-F12 and an electronic device.

H1. An electronic device, comprising: an electronic component; and the heat transfer device of any of paragraphs A1-F12 operationally coupled to the electronic component.

I1. The use of the heat transfer device of any of paragraphs A1-F12 to cool a heat source.

J1. A method of cooling a heat source, the method comprising: storing a coolant in a storage chamber; based upon an occurrence of a trigger condition, reconfiguring a barrier element from (i) a closed configuration in which the barrier element is configured to restrict the coolant from flowing from the storage chamber through a fluid passage, and to (ii) an open configuration in which the barrier element is configured to allow the coolant in the storage chamber to flow from the storage chamber through the fluid passage; and allowing the coolant to flow from the fluid passage and through a cooling chamber, wherein while the coolant flows through the cooling chamber heat is transferred from the heat source and to the coolant via one or more heat transfer components.

J1.1. The method of paragraph J1, wherein the coolant flows from the storage chamber and into the fluid passage at an initial pressure, and flows out of the fluid passage toward a cooling chamber at a final pressure, wherein the initial pressure is greater than the final pressure.

J1.2 The method of any of paragraphs J1-J1.1, wherein the fluid passage includes an expansion valve, and causing the coolant to flow through the fluid passage comprises causing the coolant to flow into the expansion valve.

J2. The method of any of paragraphs J1-J1.2, further comprising allowing heat to transfer from the heat source to the coolant in the storage chamber.

J3. The method of any of paragraphs J1-J2, wherein the storage chamber is an enclosed volume, and wherein the trigger condition includes at least one of the coolant, barrier element, and/or one or more sensor(s) reaching a trigger temperature, and/or the coolant, barrier element, and/or one or more sensor(s) reaching a trigger pressure.

J3.1. The method of paragraph J3, wherein a detection of the trigger condition is based at least in part on a Boussinesq approximation.

J4. The method of any of paragraphs J1-J3.1, wherein reconfiguring the barrier element includes a burst disc passively rupturing when the coolant reaches a/the trigger temperature and/or the pressure of the coolant in the storage chamber reaches a/the trigger pressure.

J5. The method of any of paragraphs J1-J3, wherein reconfiguring the barrier element includes a plunger passively rupturing a barrier when the coolant reaches the trigger temperature and/or the pressure of the coolant in the storage chamber reaches the trigger pressure.

J6. The method of any of paragraphs J1-J5, further comprising exhausting the coolant and the heat from the heat source absorbed by the coolant from a cooling chamber.

J7. The method of paragraph J6, wherein the cooling chamber includes at least one exit interface, and exhausting the coolant includes allowing the coolant, as well as any heat absorbed by the coolant during its traversal of a coolant flow path, to flow out of the heat transfer device.

J8. The method of any of paragraphs J1-J7, performed by the heat transfer device of any of paragraphs A1-F12.

As used herein, the terms "adapted" and "configured" mean that the element, component, or other subject matter is designed and/or intended to perform and/or support one or more given function(s). It is also within the scope of the present disclosure that elements, components, and/or other recited subject matter that is recited as being adapted to perform a particular function may additionally or alternatively be described as being configured to perform that function, and vice versa. Similarly, subject matter that is recited as being configured to perform a particular function may additionally or alternatively be described as being operative to perform that function.

As used herein, the term "and/or" placed between a first entity and a second entity means one of (1) the first entity, (2) the second entity, and (3) the first entity and the second entity. Multiple entries listed with "and/or" should be construed in the same manner, i.e., "one or more" of the entities so conjoined. Other entities optionally may be present other than the entities specifically identified by the "and/or" clause, whether related or unrelated to those entities specifically identified. Thus, as a non-limiting example, a reference to "A and/or B," when used in conjunction with open-ended language such as "comprising," may refer, in one example, to A only (optionally including entities other than B); in another example, to B only (optionally including entities other than A); in yet another example, to both A and B (optionally including other entities). These entities may refer to elements, actions, structures, steps, operations, values, and the like.

The various disclosed elements of apparatuses and steps of methods disclosed herein are not required to all apparatuses and methods according to the present disclosure, and the present disclosure includes all novel and non-obvious combinations and subcombinations of the various elements and steps disclosed herein. Moreover, one or more of the various elements and steps disclosed herein may define independent inventive subject matter that is separate and apart from the whole of a disclosed apparatus or method. Accordingly, such inventive subject matter is not required to be associated with the specific apparatuses and methods that are expressly disclosed herein, and such inventive subject matter may find utility in apparatuses and/or methods that are not expressly disclosed herein.

The invention claimed is:
1. A heat transfer device, comprising:
a storage chamber;
a coolant housed within the storage chamber at an initial pressure;
a cooling chamber adjacent to the storage chamber;
one or more heat transfer components positioned and configured to facilitate heat transfer from a heat source to the cooling chamber, wherein the heat source is distinct from the cooling chamber;
a fluid passage between the storage chamber and the cooling chamber; and a barrier element having:
  (i) a closed configuration in which the barrier element is configured to restrict the coolant from flowing from the storage chamber through the fluid passage and into the cooling chamber; and
  (ii) an open configuration in which the barrier element is configured to permit the coolant in the storage chamber to flow from the storage chamber through the fluid passage and into the cooling chamber, wherein the barrier element is configured to passively reconfigure from the closed configuration to the open configuration in response to a trigger condition, in which the coolant housed within the storage chamber reaches a trigger temperature or a trigger pressure;
wherein the coolant housed within the storage chamber is in a liquid state, and the fluid passage is configured to cause the coolant to transition from the liquid state to a gaseous state.

2. The heat transfer device of claim 1, wherein the fluid passage is configured to expand the coolant from the initial pressure to an expanded pressure as the coolant flows from the storage chamber through the fluid passage and to the cooling chamber responsive to the barrier element reconfiguring from the closed configuration to the open configuration.

3. The heat transfer device of claim 2, wherein the fluid passage comprises an expansion valve coupled to the storage chamber and the cooling chamber such that the coolant flows from the storage chamber and into the expansion valve at the initial pressure, and flows out of the expansion valve toward the cooling chamber at the expanded pressure, wherein the initial pressure is greater than the expanded pressure.

4. The heat transfer device of claim 1, further comprising:
an additional storage chamber;
additional coolant housed within the additional storage chamber;
an additional fluid passage between the additional storage chamber and the cooling chamber; and
an additional barrier element having (i) a closed configuration in which the additional barrier element is configured to restrict the additional coolant from flowing from the additional storage chamber through the additional fluid passage and into the cooling chamber, and (ii) an open configuration in which the additional barrier element is configured to allow the additional coolant in the additional storage chamber to flow from the additional storage chamber through the additional fluid passage and into the cooling chamber.

5. The heat transfer device of claim 4, wherein the additional barrier element is configured to reconfigure from the closed configuration to the open configuration in response to an additional trigger condition, and wherein the additional trigger condition is different from the trigger condition.

6. The heat transfer device of claim 1, further comprising:
an additional storage chamber;
additional coolant housed within the additional storage chamber, wherein the fluid passage is further configured to allow coolant to flow between the additional storage chamber and the cooling chamber; and
an additional barrier element having (i) a closed configuration in which the additional barrier element is configured to restrict the additional coolant from flowing from the storage chamber through the fluid passage and into the cooling chamber, and (ii) an open configuration in which the additional barrier element is configured to allow the additional coolant in the additional storage chamber to flow from the additional storage chamber through the fluid passage and into the cooling chamber.

7. The heat transfer device of claim 1, wherein a current pressure of the coolant in the storage chamber is a driving pressure that forces the coolant in the storage chamber to flow through the fluid passage and into the cooling chamber.

8. The heat transfer device of claim 1, wherein the barrier element comprises a burst disc that is configured to rupture in response to at least one of:
at least one of the coolant, the barrier element, and the burst disc reaching the trigger temperature, and
a current pressure of the coolant in the storage chamber reaching the trigger pressure.

9. The heat transfer device of claim 1, wherein the barrier element comprises a plunger that is configured to, when the trigger condition occurs, create a passage that the coolant can flow through.

10. The heat transfer device of claim 9, wherein the barrier element comprises a burst disc, and wherein the plunger is configured to rupture the burst disc to create the passage.

11. The heat transfer device of claim 10, wherein the barrier element further comprises a restraining element configured to restrain the plunger to maintain the barrier element in the closed configuration until occurrence of the trigger condition, and wherein the restraining element is configured to permit the plunger to rupture the burst disc responsive to the trigger condition.

12. The heat transfer device of claim 11, wherein the restraining element comprises a material that melts at the trigger temperature.

13. The heat transfer device of claim 10, wherein the barrier element further comprises an electrical circuit that has a sensor that is configured to detect the trigger condition, and wherein the electrical circuit is configured to cause the plunger to rupture the burst disc upon the sensor detecting the trigger condition.

14. The heat transfer device of claim 1, wherein the barrier element comprises a membrane configured to: restrict the coolant from flowing across the membrane when a current pressure of the coolant in the storage chamber is below a threshold pressure; and allow the coolant to flow across the membrane when the current pressure of the coolant in the storage chamber is greater than or equal to the threshold pressure.

15. The heat transfer device of claim 1, wherein the one or more heat transfer components define at least one coolant path for the coolant to flow within the cooling chamber.

16. The heat transfer device of claim 1, wherein the cooling chamber further comprises multiple curved vanes that define multiple curved coolant flow paths extending radially outward from the fluid passage, and wherein the cooling chamber further comprises multiple exit interfaces through which the coolant is permitted to exit the multiple curved coolant flow paths.

17. The heat transfer device of claim 16, wherein the cooling chamber further comprises a plurality of heat transfer components positioned within the multiple curved coolant flow paths.

18. The heat transfer device of claim 16, wherein the multiple curved vanes comprise cutouts to allow the coolant to flow between the multiple curved coolant flow paths.

19. The heat transfer device of claim 16, wherein the cooling chamber comprises a central distribution location, through which the coolant enters the multiple curved coolant flow paths, and wherein the multiple curved vanes extend radially outward from the central distribution location.

20. A heat transfer device, comprising:
   a storage chamber;
   a coolant housed within the storage chamber at an initial pressure;
   a cooling chamber adjacent to the storage chamber;
   one or more heat transfer components positioned and configured to facilitate heat transfer from a heat source to the cooling chamber, wherein the heat source is distinct from the cooling chamber;
   a fluid passage between the storage chamber and the cooling chamber; and
   a barrier element having:
      (i) a closed configuration in which the barrier element is configured to restrict the coolant from flowing from the storage chamber through the fluid passage and into the cooling chamber; and
      (ii) an open configuration in which the barrier element is configured to permit the coolant in the storage chamber to flow from the storage chamber through the fluid passage and into the cooling chamber, wherein the barrier element is configured to passively reconfigure from the closed configuration to the open configuration in response to a trigger condition, in which the coolant housed within the storage chamber reaches a trigger temperature or a trigger pressure;
   wherein the fluid passage is configured to expand the coolant from the initial pressure to an expanded pressure as the coolant flows from the storage chamber through the fluid passage and to the cooling chamber responsive to the barrier element reconfiguring from the closed configuration to the open configuration; and
   wherein the fluid passage comprises an expansion valve coupled to the storage chamber and the cooling chamber such that the coolant flows from the storage chamber and into the expansion valve at the initial pressure, and flows out of the expansion valve toward the cooling chamber at the expanded pressure, wherein the initial pressure is greater than the expanded pressure.

21. A heat transfer device, comprising:
   a storage chamber;
   a coolant housed within the storage chamber at an initial pressure;
   a cooling chamber adjacent to the storage chamber;
   one or more heat transfer components positioned and configured to facilitate heat transfer from a heat source to the cooling chamber, wherein the heat source is distinct from the cooling chamber;
   a fluid passage between the storage chamber and the cooling chamber; and
   a barrier element having:
      (i) a closed configuration in which the barrier element is configured to restrict the coolant from flowing from the storage chamber through the fluid passage and into the cooling chamber; and
      (ii) an open configuration in which the barrier element is configured to permit the coolant in the storage chamber to flow from the storage chamber through the fluid passage and into the cooling chamber, wherein the barrier element is configured to passively reconfigure from the closed configuration to the open configuration in response to a trigger condition, in which the coolant housed within the storage chamber reaches a trigger temperature or a trigger pressure;
   wherein the barrier element comprises a burst disc that is configured to rupture in response to at least one of:
      at least one of the coolant, the barrier element, and the burst disc reaching the trigger temperature, and
      a current pressure of the coolant in the storage chamber reaching the trigger pressure.

22. A heat transfer device, comprising:
   a storage chamber;
   a coolant housed within the storage chamber at an initial pressure;
   a cooling chamber adjacent to the storage chamber;
   one or more heat transfer components positioned and configured to facilitate heat transfer from a heat source to the cooling chamber, wherein the heat source is distinct from the cooling chamber;
   a fluid passage between the storage chamber and the cooling chamber; and
   a barrier element having:
      (i) a closed configuration in which the barrier element is configured to restrict the coolant from flowing from the storage chamber through the fluid passage and into the cooling chamber; and
      (ii) an open configuration in which the barrier element is configured to permit the coolant in the storage chamber to flow from the storage chamber through the fluid passage and into the cooling chamber, wherein the barrier element is configured to passively reconfigure from the closed configuration to the open configuration in response to a trigger condition, in which the coolant housed within the storage chamber reaches a trigger temperature or a trigger pressure;
   wherein the barrier element comprises a plunger that is configured to, when the trigger condition occurs, create a passage that the coolant can flow through.

23. The heat transfer device of claim 22, wherein the barrier element comprises a burst disc, and wherein the plunger is configured to rupture the burst disc to create the passage.

24. The heat transfer device of claim 23, wherein the barrier element further comprises a restraining element configured to restrain the plunger to maintain the barrier element in the closed configuration until occurrence of the trigger condition, and wherein the restraining element is configured to permit the plunger to rupture the burst disc responsive to the trigger condition.

25. The heat transfer device of claim 24, wherein the restraining element comprises a material that melts at the trigger temperature.

26. The heat transfer device of claim 23, wherein the barrier element further comprises an electrical circuit that has a sensor that is configured to detect the trigger condition, and wherein the electrical circuit is configured to cause the plunger to rupture the burst disc upon the sensor detecting the trigger condition.

27. A heat transfer device, comprising:
   a storage chamber;
   a coolant housed within the storage chamber at an initial pressure;
   a cooling chamber adjacent to the storage chamber;
   one or more heat transfer components positioned and configured to facilitate heat transfer from a heat source to the cooling chamber, wherein the heat source is distinct from the cooling chamber;
   a fluid passage between the storage chamber and the cooling chamber; and a barrier element having:
- (i) a closed configuration in which the barrier element is configured to restrict the coolant from flowing from the storage chamber through the fluid passage and into the cooling chamber; and
- (ii) an open configuration in which the barrier element is configured to permit the coolant in the storage chamber to flow from the storage chamber through the fluid passage and into the cooling chamber, wherein the barrier element is configured to passively reconfigure from the closed configuration to the open configuration in response to a trigger condition, in which the coolant housed within the storage chamber reaches a trigger temperature or a trigger pressure;

wherein the barrier element comprises a membrane configured to: restrict the coolant from flowing across the membrane when a current pressure of the coolant in the storage chamber is below a threshold pressure; and allow the coolant to flow across the membrane when the current pressure of the coolant in the storage chamber is greater than or equal to the threshold pressure.

28. A heat transfer device, comprising:
a storage chamber;
a coolant housed within the storage chamber at an initial pressure;
a cooling chamber adjacent to the storage chamber;
one or more heat transfer components positioned and configured to facilitate heat transfer from a heat source to the cooling chamber, wherein the heat source is distinct from the cooling chamber;
a fluid passage between the storage chamber and the cooling chamber; and
a barrier element having:
- (i) a closed configuration in which the barrier element is configured to restrict the coolant from flowing from the storage chamber through the fluid passage and into the cooling chamber; and
- (ii) an open configuration in which the barrier element is configured to permit the coolant in the storage chamber to flow from the storage chamber through the fluid passage and into the cooling chamber, wherein the barrier element is configured to passively reconfigure from the closed configuration to the open configuration in response to a trigger condition, in which the coolant housed within the storage chamber reaches a trigger temperature or a trigger pressure;

wherein the cooling chamber further comprises multiple curved vanes that define multiple curved coolant flow paths extending radially outward from the fluid passage, and wherein the cooling chamber further comprises multiple exit interfaces through which the coolant is permitted to exit the multiple curved coolant flow paths.

29. The heat transfer device of claim 28, wherein the cooling chamber further comprises a plurality of heat transfer components positioned within the multiple curved coolant flow paths.

30. The heat transfer device of claim 28, wherein the multiple curved vanes comprise cutouts to allow the coolant to flow between the multiple curved coolant flow paths.

31. The heat transfer device of claim 28, wherein the cooling chamber comprises a central distribution location, through which the coolant enters the multiple curved coolant flow paths, and wherein the multiple curved vanes extend radially outward from the central distribution location.

* * * * *